United States Patent
Shirasaki

(10) Patent No.: US 7,515,123 B2
(45) Date of Patent: Apr. 7, 2009

(54) DISPLAY APPARATUS

(75) Inventor: Tomoyuki Shirasaki, Higashiyamato (JP)

(73) Assignee: Casio Computer Co., Ltd, Tokyo (JP)

( * ) Notice: Subject to any disclaimer, the term of this patent is extended or adjusted under 35 U.S.C. 154(b) by 678 days.

(21) Appl. No.: 10/874,914

(22) Filed: Jun. 22, 2004

(65) Prior Publication Data
US 2004/0263443 A1    Dec. 30, 2004

(30) Foreign Application Priority Data
Jun. 27, 2003    (JP)    ............................. 2003-185317

(51) Int. Cl.
*G09G 3/30*    (2006.01)
(52) U.S. Cl. ......................... 345/76; 345/204; 315/169
(58) Field of Classification Search ................... 345/76, 345/204; 315/169
See application file for complete search history.

(56) References Cited

U.S. PATENT DOCUMENTS

| | | | | |
|---|---|---|---|---|
| 6,333,603 B1 * | 12/2001 | Juang et al. | ............... | 315/169.3 |
| 6,771,256 B1 * | 8/2004 | Abraham et al. | ............ | 345/204 |
| 7,122,835 B1 * | 10/2006 | Ikeda et al. | .................... | 257/72 |

FOREIGN PATENT DOCUMENTS

| | | | |
|---|---|---|---|
| CN | 1230870 A | | 10/1999 |
| CN | 1336629 A | | 2/2002 |
| GB | WO 03/038798 | * | 8/2003 |
| JP | 9-325191 A | | 12/1997 |
| JP | 2000-3785 A | | 1/2000 |
| JP | 2002-244587 A | | 8/2002 |
| JP | 2003-59648 A | | 2/2003 |
| JP | 2003-108028 A | | 4/2003 |
| JP | 2004-184797 A | | 7/2004 |
| JP | 2005-3695 A | | 1/2005 |
| WO | WO 03/023745 A1 | | 3/2003 |

OTHER PUBLICATIONS

Japanese Office Action dated Jun. 10, 2008 issued in counterpart Japanese Application No. 2003-185317 and English translation thereof.

* cited by examiner

*Primary Examiner*—Richard Hjerpe
*Assistant Examiner*—Leonid Shapiro
(74) *Attorney, Agent, or Firm*—Frishauf, Holtz, Goodman & Chick, P.C.

(57) ABSTRACT

A display apparatus includes a driving circuit mounted on a board, and a coating film which coats the driving circuit. A display unit having a plurality of optical elements are arrayed on the coating film as pixels and being driven by the driving circuit. Each of the optical elements has a pair of electrodes and exhibits an optical operation corresponding to a current that flows between the pair of electrodes.

18 Claims, 15 Drawing Sheets

DISPLAY APPARATUS

CROSS-REFERENCE TO RELATED APPLICATIONS

This application is based upon and claims the benefit of priority from prior Japanese Patent Application No. 2003-185317, filed Jun. 27, 2003, the entire contents of which are incorporated herein by reference.

BACKGROUND OF THE INVENTION

1. Field of the Invention

The present invention relates to an electroluminescent display apparatus which uses electroluminescent elements as pixels.

2. Description of the Related Art

Development of electroluminescent display apparatuses which use electroluminescent elements (to be referred to as EL elements hereinafter) as pixels has been flourishing in recent years. An EL element has an EL layer sandwiched between an anode and a cathode. In the EL display apparatus, such EL elements are arrayed in a matrix as pixels. EL display apparatuses, like liquid crystal display apparatuses, are classified into two types: those using an active driving system and those using a passive driving system. In the active driving system, a TFT is formed for each pixel to individually drive the pixels. In the passive driving system, each row is sequentially selected, and all pixels of the selected row are caused to emit light in synchronism with selection (e.g., Jpn. Pat. Appln. KOKAI Publication No. 2003-108028).

Generally, an EL display apparatus has a display panel including a plurality of EL elements arrayed in a matrix on a substrate. Driving circuits to execute drive the display are arranged around the display panel as IC chips. Since the IC chips are arranged around the screen of the display panel, the region not occupied by the screen is large.

BRIEF SUMMARY OF THE INVENTION

The present invention has an advantage in reducing the region not occupied by the screen of an EL display apparatus.

According to an aspect of the present invention, there is provided a display apparatus comprising:

a board;

a driving circuit which is mounted on the board;

a coating film which coats the driving circuit; and a display unit which has a plurality of optical elements each of which forms a pixel, the pixels being arrayed on the coating film and each being driven by the driving circuit, having a pair of electrodes, and exhibiting an optical operation in correspondence with the current that flows between the pair of electrodes.

In the display apparatus according to this aspect, the board on which the driving circuit such as an IC chip is mounted is coated with the coating film. The display unit is formed on the coating film. With this arrangement, no driving circuits need be arranged around the display region of the board, i.e., arranged without overlapping the display region. For this reason, the non-display area of the display apparatus can be reduced in size, and the panel size of the display apparatus can be reduced. The display apparatus can particularly be applied as a display panel of a compact portable device such as a digital still camera or digital video camera. Since the driving circuits or circuit and driving circuit wiring lines are formed at positions overlapping the display unit, an arbitrary number of driving circuits can be arranged at arbitrary positions. Hence, flexible wiring design is possible.

DETAILED DESCRIPTION OF THE INVENTION

A detailed embodiment of the present invention will be described below with reference to the accompanying drawing. However, the scope of the present invention is not limited to the illustrated examples.

Figure 1:
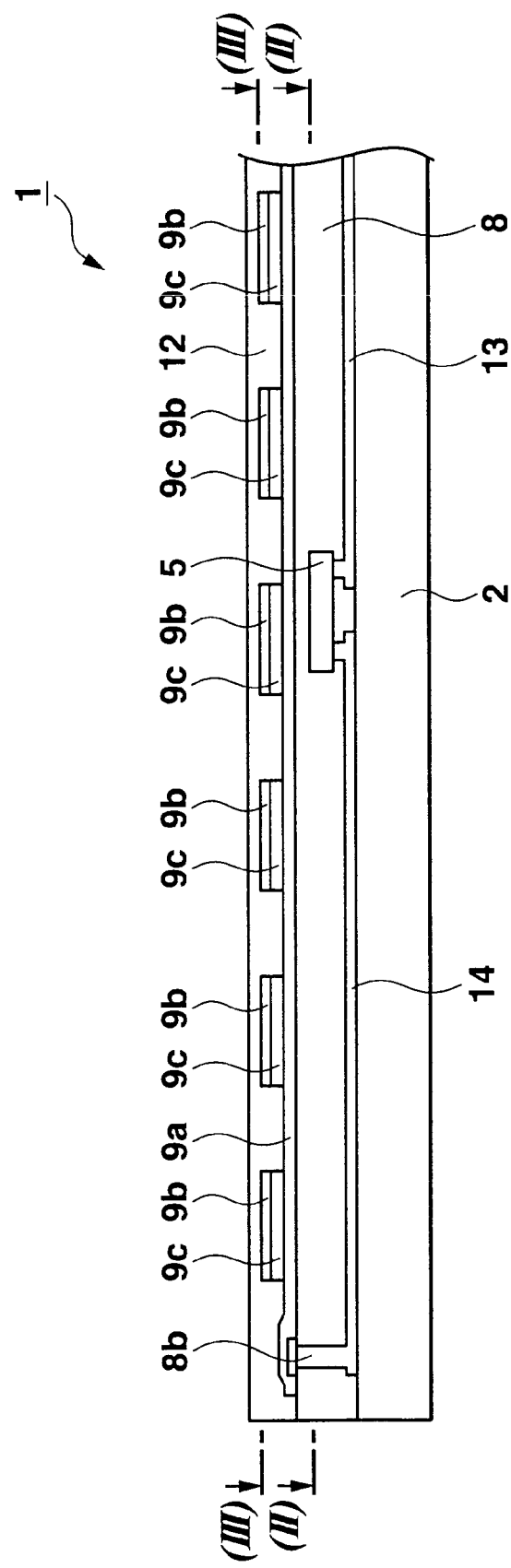
FIG. 1 is a longitudinal sectional view showing a display apparatus according to an embodiment of the present invention.
Figure 2:
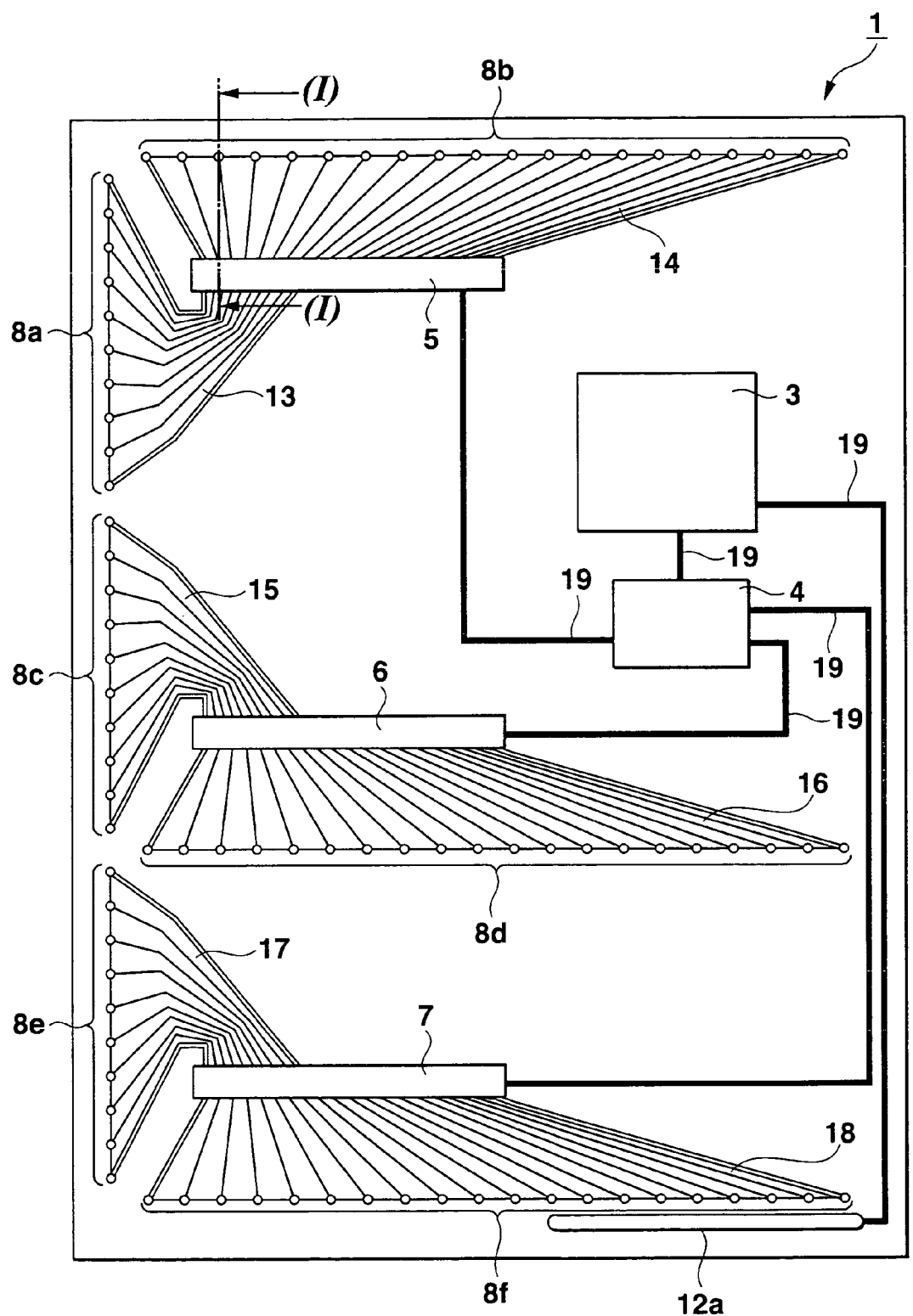
FIG. 2 is a cross-sectional view taken along a line II-II in FIG. 1.
Figure 3:
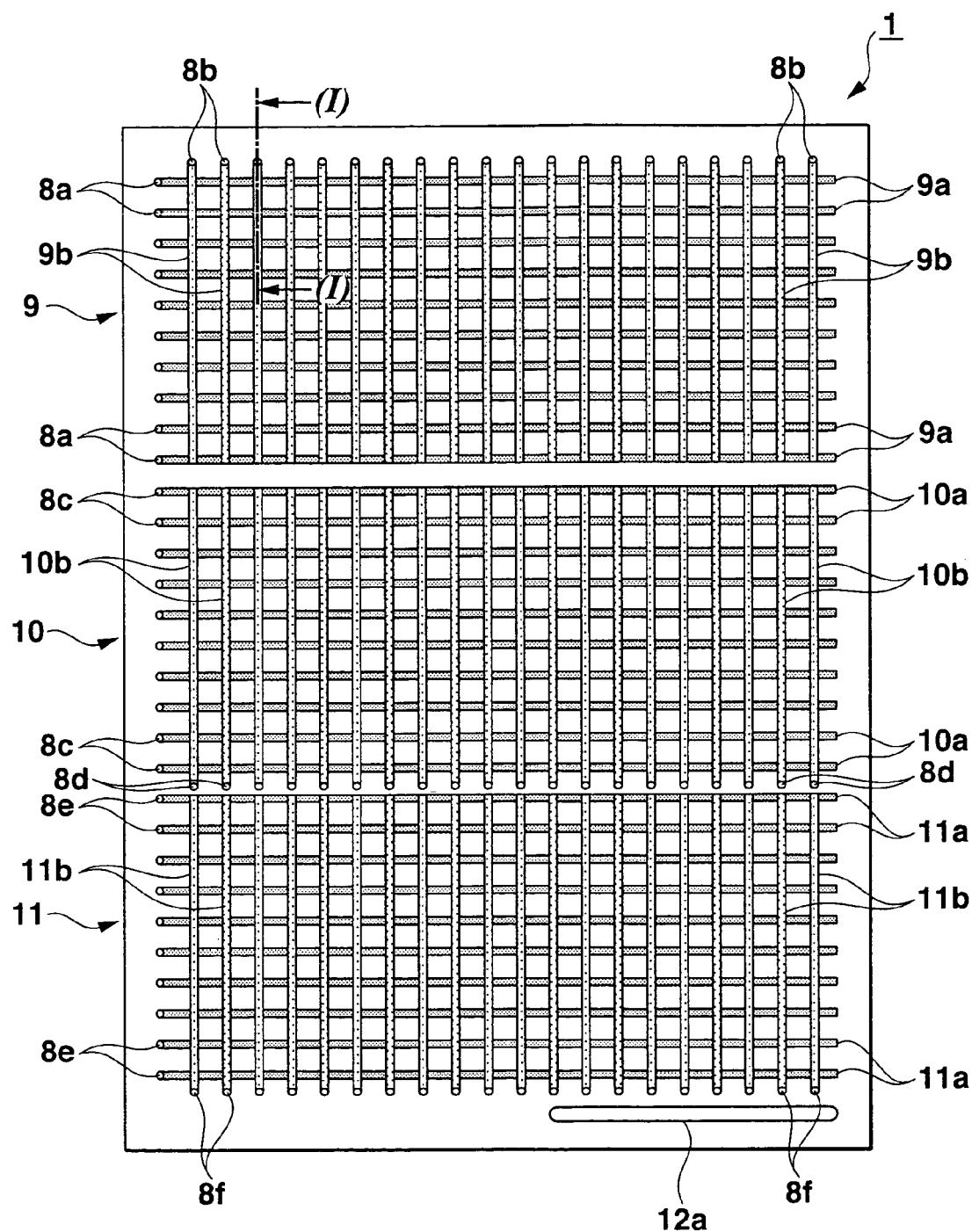
FIG. 3 is a cross-sectional view taken along a line III-III in FIG. 1.

FIG. 1 is a longitudinal sectional view showing an electroluminescent display apparatus 1 (to be referred to as the display apparatus 1 hereinafter) having a passive driving system (simple matrix driving system) to which the present invention is applied. FIG. 2 is a cross-sectional view taken along a line II-II in FIG. 1. FIG. 3 is a cross-sectional view taken along a line III-III in FIG. 1. FIG. 1 is a longitudinal sectional view taken along a line I-I in FIG. 2.

The display apparatus 1 comprises a board 2, a plurality of IC chips 3 to 7 mounted on the board 2, an insulating coating film 8 which covers the IC chips 3 to 7, a display unit having display unit sections 9 to 11 formed on the insulating coating film 8, and a sealing film 12 which seals the display unit sections 9 to 11.

The board 2 is a multilayered circuit board on which circuit wiring lines 19 for data input/output between the IC chips 3 to 7 are formed.

The IC chips 3 to 7 can be large-scale integrated circuits (LSIs), medium-scale integrated circuits (MSIs), or small-scale integrated circuits (SSIs). The IC chips 3 to 7 can be mounted by either surface mounting or through-hole mounting. The IC chips 3 to 7 can be chips encapsulated by ceramic or plastic packages or can be bare chips.

The IC chips 3 to 7 have a function of driving the display unit sections 9 to 11 as a whole. For example, the IC chip 3 incorporates a frame memory which temporarily stores externally input image data, and a CPU which controls the entire display apparatus 1. The IC chip 4 incorporates a timing generator which generates a timing clock to be output to IC chips 5, 6, and 7, and a digital-to-analog converter which converts the digital image data temporarily stored in IC chip 3 to an analog image signal which is output to IC chips 5, 6, and 7. The IC chips 5, 6, and 7 incorporate scan drivers (shift registers) which transfer scan signals to wiring lines 13, 15, and 17 connected to scan lines 9a, 10a, and 11a (to be described later) to sequentially select and scan them, and data drivers which receive the converted analog image signals at the timings of the clock signals received from the timing generator and output gray-level signals to wiring lines 14, 16, and 18 connected to signal lines 9b, 10b, and 11b (to be described later) in accordance with the analog image signals. The frame memory and CPU of IC chip 3 may be formed as separate chips. The digital-to-analog converter and timing generator of the IC chip 4 may be formed as separate chips. The scan drivers and data drivers of the IC chips 5, 6, and 7 may be formed as separate chips.

The IC chips 3 to 7 mounted on the board 2 are covered with the common insulating coating film 8. Steps generated between the surface of the board 2 and the IC chips 3 to 7 are canceled out by the insulating coating film 8. Hence, the insulating coating film 8 has an almost flat top surface. The insulating coating film 8 can be made of a resin (e.g., methacrylate resin, acrylic resin, or epoxy resin) or an inorganic nitrogen compound (e.g., silicon oxide, silicon nitride, or silicon oxynitride). Alternatively, the insulating coating film 8 may have a multilayered structure including an inorganic nitrogen compound and a resin stacked in this order.

The display surface of the display apparatus 1 is divided into three regions in the vertical direction so that the display unit sections 9, 10, and 11 can independently execute display. The display unit section 9 is driven by the IC chip 5. The display unit section 10 is driven by the IC chip 6. The display unit section 11 is driven by the IC chip 7. That is, one screen is displayed by the display unit sections 9, 10, and 11.

The display unit section 9 includes the plurality of scan lines 9a which are formed into a band shape long in the horizontal direction on the insulating coating film 8 and run parallel to each other, the signal lines 9b which are arrayed to be perpendicular to the scan lines 9a when viewed from the upper side (viewed perpendicularly to the display surface), and EL layers 9c sandwiched between the scan lines 9a and the signal lines 9b at intersections where the scan lines 9a cross the signal lines 9b. The scan lines 9a are first conductive lines having conductivity. The signal lines 9b are second conductive lines having conductivity.

A contact hole 8a extending through the insulating coating film 8 is formed at one end portion of each scan line 9a. The contact holes 8a are filled with a conductive material such as a metal. The wiring lines 13 are formed on the board 2. Each wiring line 13 electrically connects one terminal of the IC chip 5 to the metal in one contact hole 8a. Accordingly, one scan line 9a is connected to one terminal of the IC chip 5 through the metal in the contact hole 8a and wiring line 13.

A contact hole 8b is formed in the insulating coating film 8 at one end portion of each signal line 9b and filled with a conductive material such as a metal. The wiring lines 14 from the IC chip 5 to the contact holes 8b are formed on the board 2. Accordingly, one signal line 9b is connected to one terminal of the IC chip 5 through the metal-filled contact hole 8b and wiring line 14.

The EL layer 9c may have a three-layered structure including a hole transport layer, a light-emitting layer, and an electron transport layer stacked in this order or in a reverse order. Alternatively, the EL layer 9c may have a two-layered structure including a hole transport layer and a light-emitting layer stacked in this order or in a reverse order. The EL layer 9c may have a single-layered structure including only a light-emitting layer. Alternatively, the EL layer 9c may have a multi-layered structure having an electron or hole injection layer inserted between appropriate layers in one of the above layer structures. All the layers included in the EL layer 9c may be made of organic compounds. All the layers included in the EL layer 9c may be made of inorganic compounds. The EL layer 9c may be formed by stacking a layer made of an inorganic compound and a layer made of an organic compound. In this example, the EL layer 9c has a two-layered structure in which a hole transport layer made of PEDOT (polythiophene) as a conductive polymer and PSS (polystyrene sulfonate) as a dopant, and a light-emitting layer made of a polyfluorene-based light-emitting material are stacked in this order.

The intersections where the scan lines 9a cross the signal lines 9b are arrayed in a matrix on the insulating coating film 8. Each of the intersections where the scan lines 9a cross the signal lines 9b has a multilayered structure including the scan line part, EL layer 9c, and signal line part stacked in this order from the side of the insulating coating film 8. This multilayered structure serves as an EL element and forms a pixel. The anode of the EL element may be the scan line 9a while the cathode may be the signal line 9b. Conversely, the anode may be the signal line 9b while the cathode may be the scan line 9a.

The signal line 9b has optical transparency and is made of indium oxide, zinc oxide, tin oxide, or cadmium tin oxide (CTO), or a mixture containing at least one of them (e.g., indium tin oxide (ITO) or indium zinc oxide). The scan line 9a is made of a metal, a metal compound, or an alloy.

When the signal line 9b serves as a cathode, and the work function of the signal line 9b itself is relatively high, an electron injection layer having a low work function and made of a single metal such as magnesium, calcium, lithium, or barium, or a rare earth metal, or an alloy containing at least one of these single substances is preferably formed between the signal line 9b and the EL layer 9c. In this case, the electron injection layer is preferably as thin as possible such that light can pass through it.

The display unit section 10 also includes the plurality of scan lines 10a which have a band shape long in the horizontal direction and run parallel to each other, the plurality of signal lines 10b which are arrayed to be perpendicular to the scan lines 10a when viewed from the upper side, and EL layers (not shown) sandwiched between the scan lines 10a and the signal lines 10b at intersections where the scan lines 10a cross the signal lines 10b, like the display unit section 9.

A contact hole 8c is formed in the insulating coating film 8 at one end portion of each scan line 10a and filled with a conductive material such as a metal. The wiring lines 15 from the IC chip 6 to the contact holes 8c are formed on the board 2. One scan line 10a is connected to one terminal of the IC chip 6 through the metal-filled contact hole 8c and wiring line 15. One signal line 10b is connected to one terminal of the IC chip 6 through a metal filled contact hole 8d formed in the insulating coating film 8 at one end portion of the signal line 10b and one of the wiring lines 16 formed on the board 2.

The display unit section 11 also includes the plurality of scan lines 11a which have a band shape long in the horizontal direction and run parallel to each other, the signal lines 11b which are arrayed to be perpendicular to the scan lines 11a when viewed from the upper side, and EL layers (not shown) sandwiched between the scan lines 11a and the signal lines 11b at intersections where the scan lines 11a cross the signal lines 11b, like the display unit section 9.

One scan line 11a is connected to one terminal of the IC chip 7 through a metal filled metal filled contact hole 8e formed in the insulating coating film 8 at one end portion of the scan line 11a and one of the wiring lines 17 formed on the board 2. Similarly, one signal line 11b is connected to one terminal of the IC chip 7 through a contact hole 8f formed in the insulating coating film 8 at one end portion of the signal line 11b and one of the wiring lines 18 formed on the board 2.

The sealing film 12 is formed on the entire surface to cover all the scan lines 9a, signal lines 9b, scan lines 10a, signal lines 10b, scan lines 11a, and signal lines 11b. The sealing film 12 has optical transparency to light and insulating properties. The sealing film 12 is made of a resin (e.g., methacrylate resin, acrylic resin, or epoxy resin) or an inorganic nitrogen compound (e.g., silicon oxide, silicon nitride, or silicon oxynitride).

A contact hole 12a extending through the sealing film 12 and insulating coating film 8 is formed near the outer edge of the sealing film 12 not to overlap the display unit sections 9, 10, and 11. The circuit wiring line 19 is guided to the contact hole 12a in or on the board 2. The contact hole 12a is filled with a conductive material. The conductive material which fills the contact hole 12a serves as a terminal of the display apparatus 1 to receive an external signal.

A method of manufacturing the display apparatus 1 will be described next.

First, the board 2 on which the wiring lines 13 to 18 and circuit wiring lines 19 are formed is prepared. The IC chips 3 to 7 are mounted on the board 2. The insulating coating film 8 is formed on one surface of the board 2 to entirely cover the IC chips 3 to 7. The contact holes 8a, 8b, 8c, 8d, 8e, and 8f are formed in the insulating coating film 8 and filled with a conductive material. The scan lines 9a, 10a, and 11a are by metal depositing and selectively patterning formed on the insulating coating film 8. The EL layers 9c of the display unit section 9, the EL layers of the display unit section 10, and the EL layers of the display unit section 11 are deposited and them patterned. The signal lines 9b, 10b, and 11b are patterned to be perpendicular to the scan lines 9a, 10a, and 11a on the formed EL layers. The sealing film 12 is formed on the entire surface of the insulating coating film 8 to cover the scan lines 9a, signal lines 9b, scan lines 10a, signal lines 10b, scan lines 11a, and signal lines 11b. The contact hole 12a is formed in the sealing film 12 and insulating coating film 8 and filled with a conductive material.

The operation of the display apparatus 1 will be described next.

Image data of one frame is externally input through the metal filled contact hole 12a. The input image data is temporarily stored in the IC chip 3 and processed by it. The processed image data is output to the IC chip 4 and digital-to-analog-converted. The digital-to-analog-converted image signal is output to the IC chips 5, 6, and 7. The IC chip 5 drives the display unit section 9 in accordance with the image signal by the passive driving system. The IC chip 6 drives the display unit section 10 in accordance with the image signal by the passive driving system. The IC chip 7 drives the display unit section 11 in accordance with the image signal by the passive driving system. In the display unit section 9, the scan lines 9a are sequentially selected by the IC chip 5. A gray level signal corresponding to the image signal is output to all the signal lines 9b by the IC chip 5 in synchronism with selection of each scan line 9a. The display unit sections 10 and 11 also execute the same display operation as in the display unit section 9. The display unit sections 9 to 11 execute display simultaneously in one frame period.

When the display unit sections 9, 10, and 11 are driven, the EL layers emit light. The light emitted from the EL layers passes through the signal lines 9b, 10b, and 11b and radiates outside from the sealing film 12. That is, the display apparatus 1 has a so-called top emission structure so that the surface of the sealing film 12 opposite to the board 2 functions as a display surface.

As described above, in this embodiment, the board 2 on which the IC chips 3 to 7 are mounted is covered with the insulating coating film 8. The display unit sections 9 to 11 are formed on the insulating coating film 8. The IC chips 3 to 7 overlap the display unit sections 9 to 11 when viewed from the upper side. Hence, the display apparatus 1 rarely has a region except the display region.

The signal lines 9b, 10b, and 11b and the sealing film 12 are transparent. For this reason, even when the IC chips 3 to 7 overlap the display unit sections 9 to 11, light emitted from the EL layers emerges outside from the sealing film 12.

Since the display unit sections 9 to 11 are independently driven, the light emission duty of the display apparatus 1 itself can be increased. More specifically, assume that the display unit sections 9, 10, and 11 have N (N is a natural number) scan lines 9a, 10a, and 11b, respectively. The light emission duty in each of the display unit sections 9 to 11 is 1/N. Even when the total number of scan lines in the display apparatus 1 is 3×N, the light emission duty is 1/N. In a conventional EL display apparatus having 3×N scan lines in total, the driving circuits are arranged around the display panel. For this reason, even when two data drivers are prepared on the upper and lower sides of the display region, the display apparatus can independently be driven in only two regions at maximum. In the conventional EL display apparatus having 3×N scan lines in total, the light emission duty can be increased to only 2/(3×N). The light emission duty is larger in the display apparatus 1 of this embodiment. The display apparatus 1 of this embodiment can implement a bright display surface even at a low power. Accordingly, the service life of the display apparatus 1 can be prolonged.

If signals are to be output from one IC chip to all signal lines, and the number of scan lines is 3N, the duty is 1/(3×N). However, as in the present embodiment, when the display surface is divided into the display unit sections 9 to 11, and they are individually driven by the IC chips 5 to 7, the display unit sections 9 to 11 can execute display simultaneously in one frame period. For this reason, even when the total number of scan lines of the display unit sections 9 to 11 is 3×N, each of the IC chips 5, 6, and 7 is driven at a duty of 1/N. That is, the selection period to cause the EL elements of the display unit sections 9, 10, and 11 to emit light can be increased to three times. As compared to the case wherein signals are output from one IC chip to all signal lines, the voltage applied to each EL layer of the display unit sections 9, 10, and 11 can be decreased to ⅓. Hence, any degradation caused by the voltage can be suppressed.

In addition, since the IC chip 3 incorporating a CPU is mounted on the board 2, the display apparatus 1 can have multiple functions. Furthermore, since the IC chip 3 incorporating a frame memory is mounted on the board 2, the display state on the display apparatus 1 can be maintained without inputting image data from the outside.

It is almost impossible to form the CPU, frame memory, digital-to-analog converter, timing generator, scan drivers, and data drivers directly on the board 2 because every component has its own optimum pressure resistance, heat resistance, and process. In this embodiment, however, since the IC chips 3 to 7 designed in advance in accordance with optimum pressure resistances, heat resistances, and processes are mounted on the board 2, the display apparatus 1 having the functions of the CPU, frame memory, digital-to-analog converter, timing generator, scan drivers, and data drivers can be provided.

The present invention is not limited to the above-described embodiment, and various changes and modifications can be made without departing from the spirit and scope of the present invention.

For example, in the above embodiment, each of the display unit sections 9, 10, and 11 has a multilayered structure in which scan lines, EL layers, and transparent signal lines are stacked in this order. However, signal lines, EL layers, and transparent scan lines may be stacked in this order. The display surface is divided into three parts on units. Instead, the display surface may be divided into four or more parts.

In the above embodiment, each of the display unit sections 9 to 11 has EL layers which are formed independently at the intersections between the scan lines and the signal lines. However, a common EL layer may be formed. More specifically, the display unit section 9 may have one EL layer which covers all the scan lines 9a. The display unit section 10 may have one EL layer which covers all the scan lines 10a. The display unit section 11 may have one EL layer which covers all the scan lines 11a. In this case, an EL layer common to all the display unit sections 9 to 11 may be formed.

The following modifications are also possible. The same reference numerals as in the display apparatus 1 of the above embodiment denote the same constituent elements in the following modifications.

[First Modification]

Figure 4:
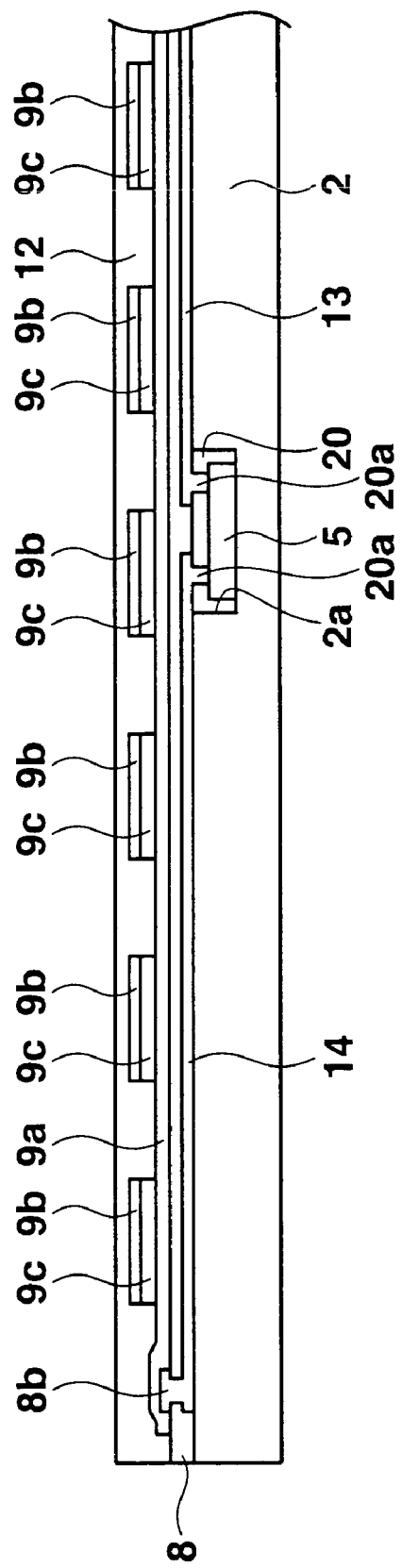
FIG. 4 is a longitudinal sectional view, corresponding to FIG. 1, showing an EL display apparatus according to the first modification.

In the display apparatus 1 of the above embodiment, the IC chips 3 to 7 are surface-mounted on the board 2. In the EL display apparatus of the first modification, the IC chips 3 to 7 are buried in the board 2. More specifically, as shown in FIG. 4, a trenches 2a are formed in the board 2. The IC chip 5 is inserted in the trench 2a. The trench 2a is filled with a filler 20 such as a resin. The filler 20 partially covers the IC chip 5. Contact holes 20a are formed in the filler 20 and filled with a conductive material. The terminal of the IC chip 5 is connected to the circuit wiring line 19 (FIG. 2) by the conductive material. The EL display apparatus of the first modification operates in the same way as the display apparatus 1 of the above embodiment except that the IC chips 3 to 7 are buried in the board 2.

[Second Modification]

Figure 5:
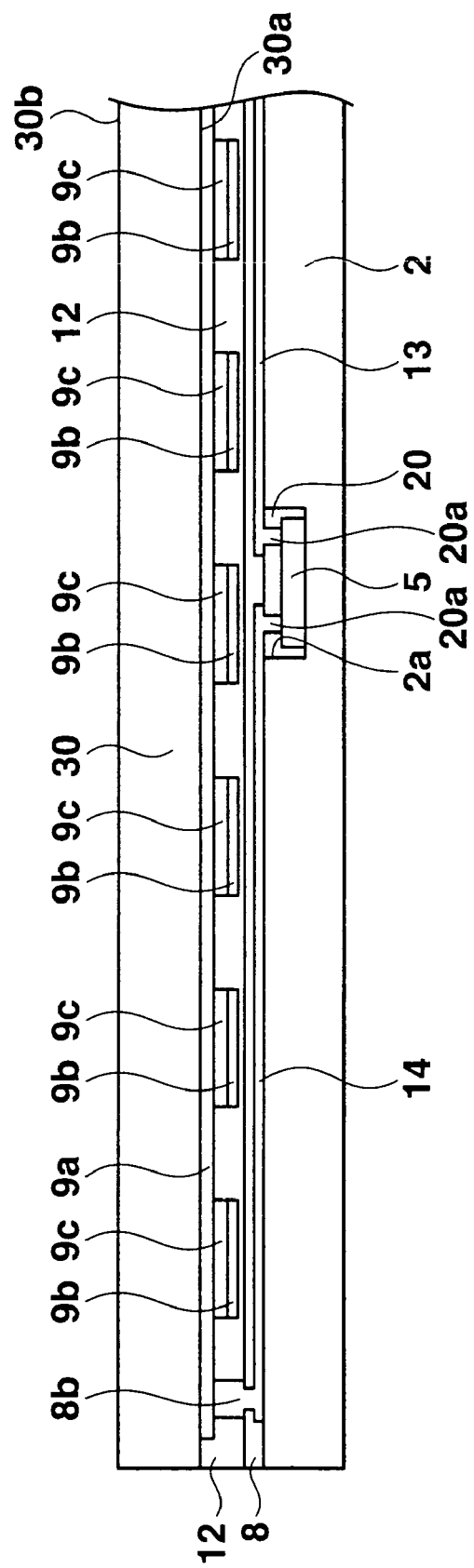
FIG. 5 is a longitudinal sectional view, corresponding to FIG. 1, showing an EL display apparatus according to the second modification.

In the EL display apparatus of the second modification, the IC chips 3 to 7 are buried in the board 2, like the display apparatus of the first modification. As shown in FIG. 5, the EL display apparatus of the second modification is manufactured by bonding a transparent substrate 30 having the display unit sections 9, 10, and 11 (FIG. 2) to the board 2 in which the IC chips 3 to 7 are buried and on which the insulating coating film 8 is formed.

As in the above embodiment and first modification in which the display unit sections 9, 10, and 11 are formed on the insulating coating film 8, the display unit sections 9, 10, and 11 are formed on an upper surface 30a of the transparent substrate 30 in the second modification. The display unit sections 9, 10, and 11 are formed on the upper surface 30a of the transparent substrate 30 in accordance with the same procedures as in forming the display unit sections 9, 10, and 11 on the insulating coating film 8 in the above embodiment.

The transparent substrate 30 is made of a transparent material such as borosilicate glass, silica glass, glass of any other type, PMMA (polymethyl methacrylate), polycarbonate, or any other resin. In the above embodiment, the signal lines 9b, 10b, and 11b are transparent. In the second modification, the scan lines 9a, 10a, and 11a are transparent and pass light.

The sealing film 12 is formed on the entire surface of the transparent substrate 30 to cover all the display unit sections 9, 10, and 11. A contact hole 12a is formed in the sealing film 12 at a position corresponding to one end portion of each of the scan lines 9a, signal lines 9b, scan lines 10a, signal lines 10b, scan lines 11a, and signal lines 11b. The contact holes 12a are filled with a conductive material. The contact holes 12a are formed at positions corresponding to the contact holes 8a to 8f.

The insulating coating film 8 is made to oppose the sealing film 12 while making the contact holes 8a to 8f correspond to the contact holes 12a. The sealing film 12 is bonded to the insulating coating film 8 by an anisotropic conductive adhesive (not shown). The anisotropic conductive adhesive has conductivity in the direction of layer (direction of thickness) but exhibits insulating properties in a direction perpendicular to the direction of layer. Hence, one of the metal filled contact holes 8a to 8f is electrically connected to one metal filled contact hole 12a through the anisotropic conductive adhesive. Accordingly, one scan line 9a is electrically connected to one terminal of the IC chip 5. One signal line 9b is electrically connected to one terminal of the IC chip 5. One scan line 10a is electrically connected to one terminal of the IC chip 6. One signal line 10b is electrically connected to one terminal of the IC chip 6. One scan line 11a is electrically connected to one terminal of the IC chip 7. One signal line 11b is electrically connected to one terminal of the IC chip 7.

The display operation is performed when the display unit sections 9, 10, and 11 are passively driven by the IC chips 5, 6, and 7. Since the scan lines 9a, 10a, and 11a and the transparent substrate 30 are transparent, light emitted from the EL layers radiates outside from a lower surface 30b of the transparent substrate 30. That is, the lower surface 30b of the transparent substrate 30 functions as a display surface.

Figure 6:
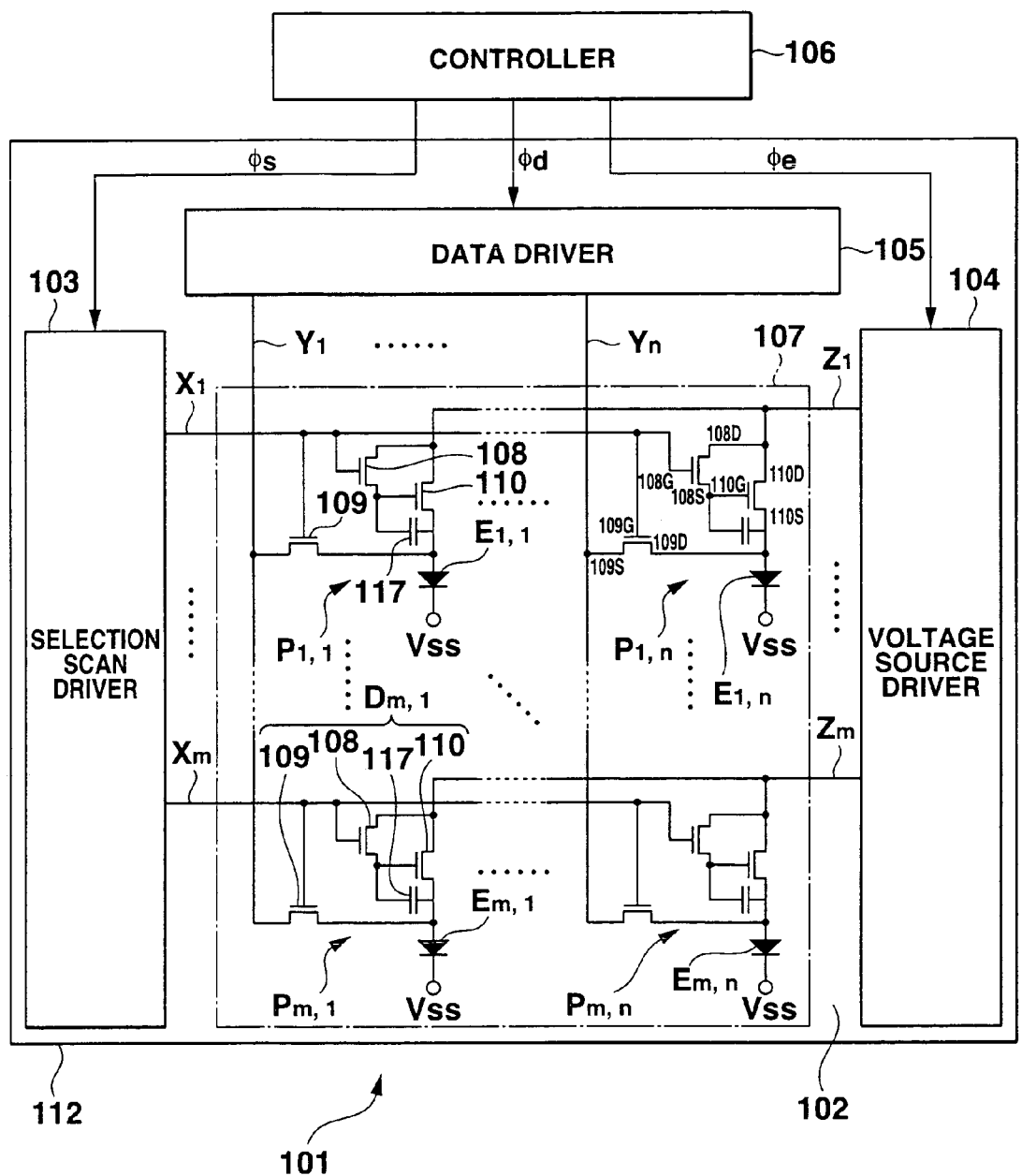
FIG. 6 is a plan view showing a display apparatus to which the present invention is applied.

The display apparatus 1 of the above embodiment is a passive driving display apparatus. Instead, an active driving display apparatus 101 as shown in FIG. 6 is also possible. Another embodiment of the present invention will be described below with reference to the accompanying drawing. However, the scope of the present invention is not limited to the illustrated examples. In the following description, "viewed from the upper side" means "viewed perpendicularly to the display surface of the display apparatus 101".

FIG. 6 is a circuit block diagram showing a detailed arrangement of a display apparatus to which the present invention is applied. As shown in FIG. 6, the display apparatus 101 is an active matrix driving display apparatus comprising, as basic components, a display unit 107 having pixels to display an image, a selection scan driver 103 to drive the pixels of the display unit 107, a voltage source driver 104, a data driver 105, and a controller 106 which controls the selection scan driver 103, voltage source driver 104, and data driver 105.

The display apparatus 101 has a two-layered structure including a first layer which is formed on a substrate 112 (FIG. 10) made of borosilicate glass, silica glass, or glass of any other type resistant to the temperature during the manufacturing process of transistors (to be described later), and a second layer formed on the first layer. The selection scan driver 103, voltage source driver 104, data driver 105, and controller 106 are formed in the first layer. The circuit elements of the display unit 107 are formed in the second layer. An interlayer dielectric film 134 is formed on the controller 106, selection scan driver 103, voltage source driver 104, and data driver 105 to protect these circuit elements in the first layer from the manufacturing process for the circuit elements in the second layer.

The selection scan driver 103, voltage source driver 104, and data driver 105 are connected to be able to receive data and control signals $\phi s$, $\phi e$, and $\phi d$ from the controller 106, respectively. Display light from the pixels of the display unit 107 is set not to emerge from the substrate 112 through the first layer. Hence, the substrate 112 need not always have a high transmittance for display light.

Figure 7:
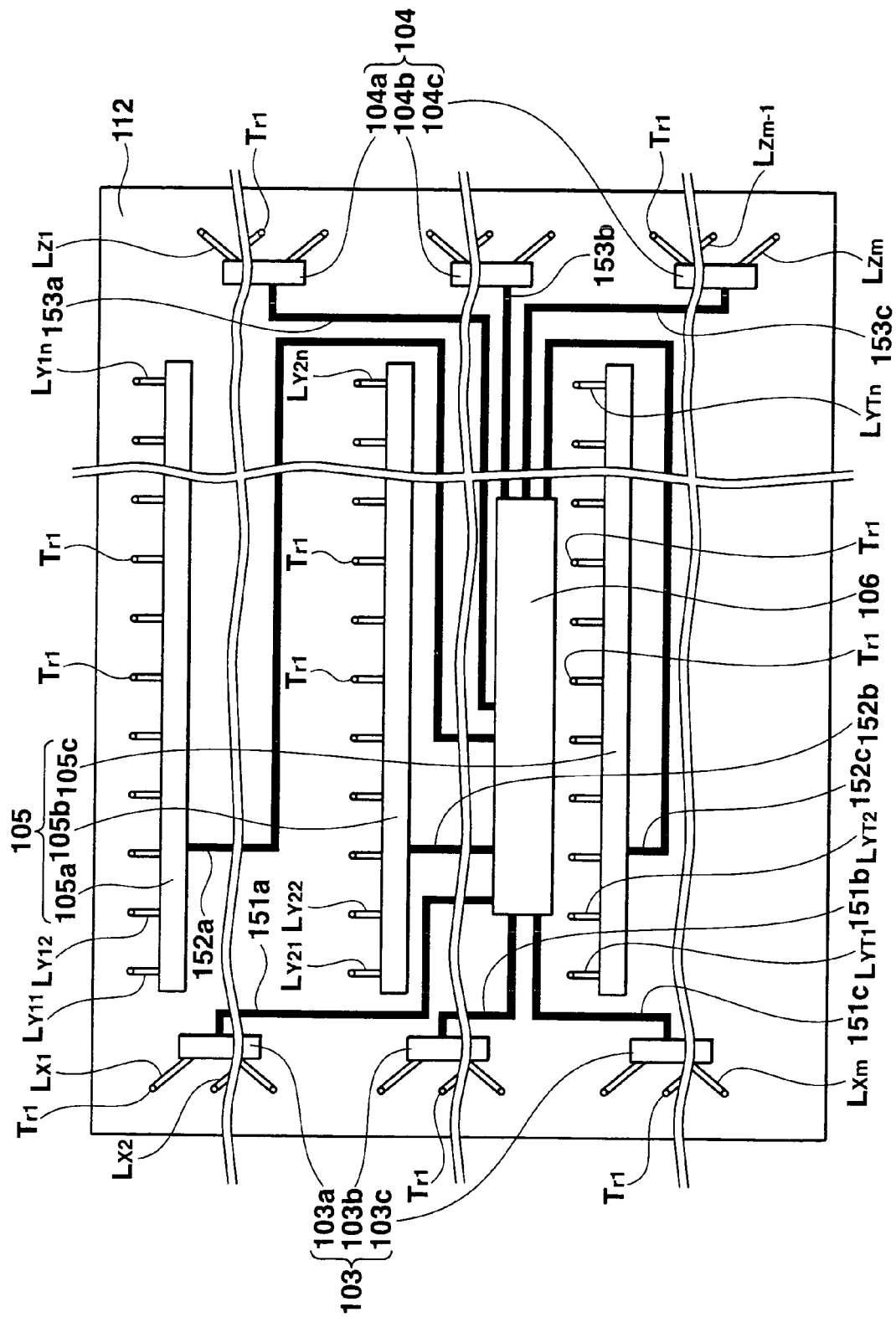
FIG. 7 is a schematic plan view showing the first layer of the display apparatus shown in FIG. 6, to which the present invention is applied.

As shown in FIG. 7, the controller 106, a first selection scan driver 103a, second selection scan driver 103b, and Sth selection scan driver 103c (S is a natural number; $S \geq 2$) which form the selection scan driver 103, a first data driver 105a, second data driver 105b, and Tth data driver 105c (T is a natural number; $T \geq 2$) which form the data driver 105, and a first voltage source driver 104a, second voltage source driver 104b, and Sth voltage source driver 104c which form the voltage source driver 104 are arranged on the substrate 112. These components do not overlap when viewed from the upper side.

The controller 106 is connected to the first selection scan driver 103a, second selection scan driver 103b, and Sth selection scan driver 103c via wiring lines 151a, 151b, and 151c, respectively. The controller 106 is also connected to the first data driver 105a, second data driver 105b, and Tth data driver 105c via wiring lines 152a, 152b, and 152c, respectively. The controller 106 is also connected to the first voltage source driver 104a, second voltage source driver 104b, and Sth voltage source driver 104c via wiring lines 153a, 153b, and 153c, respectively.

Each of the first selection scan driver 103a, second selection scan driver 103b, and Sth selection scan driver 103c sequentially outputs selection scan signals to wiring lines $L_{X1}, \ldots, L_{Xm}$ in accordance with the control signals $\phi s$ received from the controller 106.

The first data driver 105a supplies a storage current corresponding to image data to each of wiring lines $L_{Y11}, L_{Y12}, \ldots L_{Y1n}$ in accordance with the control signals $\phi d$ received from the controller 106.

The second data driver 105b supplies a storage current corresponding to image data to each of wiring lines $L_{Y21}, L_{Y22}, \ldots L_{Y2n}$ in accordance with the control signals $\phi d$ received from the controller 106.

The Tth data driver 105c supplies a storage current corresponding to image data to each of wiring lines $L_{YT1}, L_{YT2}, \ldots L_{YTn}$ in accordance with the control signals $\phi d$ received from the controller 106.

Each of the first voltage source driver 104a, second voltage source driver 104b, and Sth voltage source driver 104c sequentially outputs predetermined signals to wiring lines $L_{Z1}, L_{Z2}, \ldots L_{Zm}$ in accordance with the control signals $\phi e$ received from the controller 106.

Each of the wiring lines $L_{X1}, L_{X2}, \ldots L_{Xm}$, wiring lines $L_{Y11}, L_{Y12}, \ldots L_{Y1n}$, wiring lines $L_{Y21}, L_{Y22}, \ldots L_{Y2n}$, wiring lines $L_{YT1}, L_{YT2}, \ldots L_{YTn}$, and wiring lines $L_{Z1}, L_{Z2}, \ldots L_{Zm}$ has a terminal portion $Tr_1$ at the distal end. The terminal portions $Tr_1$ are exposed to contact holes (not shown) formed in the interlayer dielectric film 134 that covers the selection scan driver 103, voltage source driver 104, data driver 105, and controller 106.

Figure 8:
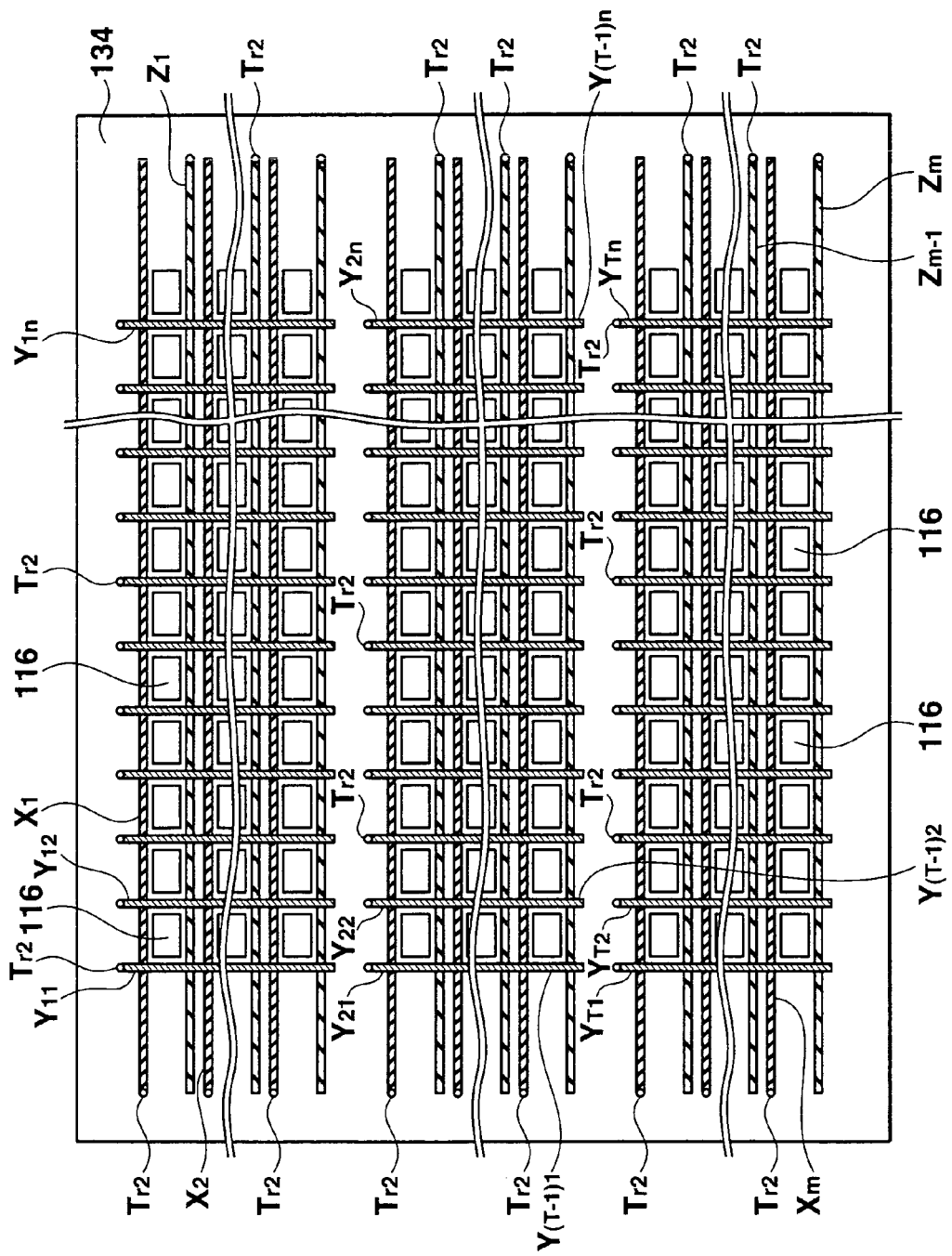
FIG. 8 is a schematic plan view showing the second layer of the display apparatus shown in FIG. 6, to which the present invention is applied.

The display unit 107 is arranged on the interlayer dielectric film 134 while at least partially overlapping the selection scan driver 103, voltage source driver 104, data driver 105, and controller 106 shown in FIG. 7 when viewed from the upper side. More specifically, in the display unit 107, as shown in FIG. 8, m selection scan lines $X_1, X_2, \ldots, X_m$ are formed on the interlayer dielectric film 134 while being arrayed parallel to each other along the row direction. In addition, m voltage source scan lines $Z_1, Z_2, \ldots Z_m$ are formed on the interlayer dielectric film 134 along the row direction. The voltage source scan lines $Z_1, Z_2, \ldots Z_m$ and the selection scan lines $X_1, X_2, \ldots, X_m$ are alternately arranged to form pairs. In addition, current lines $Y_{11}, Y_{21}, \ldots Y_{T1}, Y_{12}, Y_{22}, \ldots, Y_{T2}, \ldots, Y_{1n}, Y_{2n}, \ldots, Y_{Tn}$ are formed on the interlayer dielectric film 134 along the column direction perpendicular to the row direction.

A current line $Y_1$ of the first column shown in FIG. 6 corresponds to the current lines $Y_{11}, Y_{21}, \ldots, Y_{T1}$ in FIG. 8. A current line $Y_2$ of the second column shown in FIG. 6 corresponds to the current lines $Y_{12}, Y_{22}, \ldots, Y_{T2}$ in FIG. 8. A current line $Y_n$ of the nth column shown in FIG. 6 corresponds to the current lines $Y_{1n}, Y_{2n}, \ldots, Y_{Tn}$ in FIG. 8.

The voltage source scan lines $Z_1, Z_2, \ldots, Z_m$ are electrically insulated from the selection scan lines $X_1, X_2, \ldots, X_m$. The selection scan lines $X_1, X_2, \ldots, X_m$ and voltage source scan lines $Z_1, Z_2, \ldots, Z_m$ can be formed at once by patterning a single conductive film. The current lines $Y_{11}, Y_{12}, \ldots, Y_{1n}, Y_{21}, Y_{22}, \ldots, Y_{2n}, \ldots, Y_{T1}, Y_{T2}, \ldots, Y_{Tn}$ are formed along the column direction to cross the selection scan lines $X_1, X_2, \ldots, X_m$ and voltage source scan lines $Z_1, Z_2, \ldots, Z_m$. The current lines $Y_{11}, Y_{12}, \ldots, Y_{1n}, Y_{21}, Y_{22}, \ldots, Y_{2n}, \ldots, Y_{T1}, Y_{T2}, \ldots, Y_{Tn}$ are insulated from the selection scan lines $X_1, X_2, \ldots, X_m$ and voltage source scan lines $Z_1, Z_2, \ldots Z_m$ by inserting a gate insulating film 123 or a block insulating film 136 (to be described later).

Each of the selection scan lines $X_1, X_2, \ldots, X_m$, current lines $Y_{11}, Y_{12}, \ldots, Y_{1n}, Y_{21}, Y_{22}, \ldots, Y_{2n}, \ldots, Y_{T1}, Y_{T2}, \ldots, Y_{Tn}$, and voltage source scan lines $Z_1, Z_2, \ldots, Z_m$ has a terminal portion $Tr_2$ located at one distal end.

The terminal portions $Tr_2$ of the selection scan lines $X_1, X_2, \ldots, X_m$ are connected to the terminal portions $Tr_1$ of the wiring lines $L_{X1}, L_{X2}, \ldots, L_{Xm}$ through the contact holes formed in the interlayer dielectric film 134.

The terminal portions $Tr_2$ of the current lines $Y_{11}, Y_{12}, \ldots, Y_{1n}$ are connected to the terminal portions $Tr_1$ of the wiring lines $L_{Y11}, L_{Y12}, \ldots L_{Y1n}$ through the contact holes formed in the interlayer dielectric film 134.

The terminal portions $Tr_2$ of the current lines $Y_{21}, Y_{22}, \ldots, Y_{2n}$ are connected to the terminal portions $Tr_1$ of the wiring lines $L_{Y21}, L_{Y22}, \ldots L_{Y2n}$ through the contact holes formed in the interlayer dielectric film 134.

The terminal portions $Tr_2$ of the current lines $Y_{T1}, Y_{T2}, \ldots, Y_{Tn}$ are connected to the terminal portions $Tr_1$ of the wiring lines $L_{YT1}, L_{YT2}, \ldots L_{YTn}$ through the contact holes formed in the interlayer dielectric film 134.

The terminal portions $Tr_2$ of the voltage source scan lines $Z_1, Z_2, \ldots, Z_m$ are connected to the terminal portions $Tr_1$ of the wiring lines $L_{Z1}, L_{Z2}, \ldots L_{Zm}$ through the contact holes formed in the interlayer dielectric film 134.

A plurality of organic EL elements $E_{1,1}$ to $E_{m,n}$ are arrayed in a matrix. One organic EL element is formed in each region surrounded by the current lines $Y_{11}, Y_{12}, \ldots, Y_{1n}, Y_{21}, Y_{22}, \ldots, Y_{2n}, \ldots, Y_{T1}, Y_{T2}, \ldots, Y_{Tn}$ and the selection scan lines $X_1, X_2, \ldots, X_m$. Pixel driving circuits $D_{1,1}$ to $D_{m,n}$ are formed around the organic EL elements to supply a desired current to the organic EL elements $E_{1,1}$ to $E_{m,n}$. One organic EL element and a driving circuit arranged for it correspond to one pixel of the display unit 107. That is, one organic EL element and one driving circuit are formed for each of (m×n) pixels.

Each pixel of the display unit 107 will be described below in detail.

A plurality of pixels $P_{1,1}$ to $P_{m,n}$ (m≧1, and n≧2) are formed in a matrix in the display unit 107. In a pixel $P_{i,j}$ (1≦i≦m, and 1≦j≦n) of the ith row and jth column, an organic EL element $E_{i,j}$ of the ith row and jth column and a pixel driving circuit $D_{i,j}$ of the ith row and jth column, which drives the organic EL element $E_{i,j}$, are formed. The pixel driving circuit $D_{i,j}$ comprises a capacitor 117, first transistor 108, second transistor 109, and third transistor 110. The transistors are n-channel amorphous silicon thin-film transistors.

A gate electrode 108G of the first transistor 108 of the pixel driving circuit $D_{i,j}$ is connected to a selection scan line $X_i$ of the ith row. A drain electrode 108D is connected to a voltage source scan line $Z_i$ of the ith row. A source electrode 108S is connected to a gate electrode 110G of the third transistor 110 and one electrode of the capacitor 117.

A gate electrode 109G of the second transistor 109 of the pixel driving circuit $D_{i,j}$ is connected to the selection scan line $X_i$ of the ith row. A drain electrode 109D is connected to a source electrode 110S of the third transistor 110 and the other electrode of the capacitor 117. A source electrode 109S is connected to a current line $Y_j$ (one of current lines $Y_{1j}, Y_{2j}, \ldots, Y_{Tj}$) of the jth column.

The gate electrode 110G of the third transistor. 110 of the pixel driving circuit $D_{i,j}$ is connected to the source electrode 108S of the first transistor 108 and one electrode of the capacitor 117. A drain electrode 110D is connected to the voltage source scan line $Z_i$. The source electrode 110S is connected to a pixel electrode as one electrode of the organic EL element $E_{i,j}$, the other electrode of the capacitor 117, and the drain electrode 109D of the second transistor 109.

The capacitor 117 is connected between the gate electrode 110G and the source electrode 110S of the third transistor 110. The capacitor 117 has a function of holding the potential between the gate electrode 110G and the source electrode 110S.

The organic EL element $E_{i,j}$ has a structure in which an organic EL layer is sandwiched between a pixel electrode and a counter transparent electrode 113. The pixel electrode is connected to the source electrode 110S of the third transistor 110. A reference potential $V_{SS}$ is applied to the counter transparent electrode 113.

Figure 9:
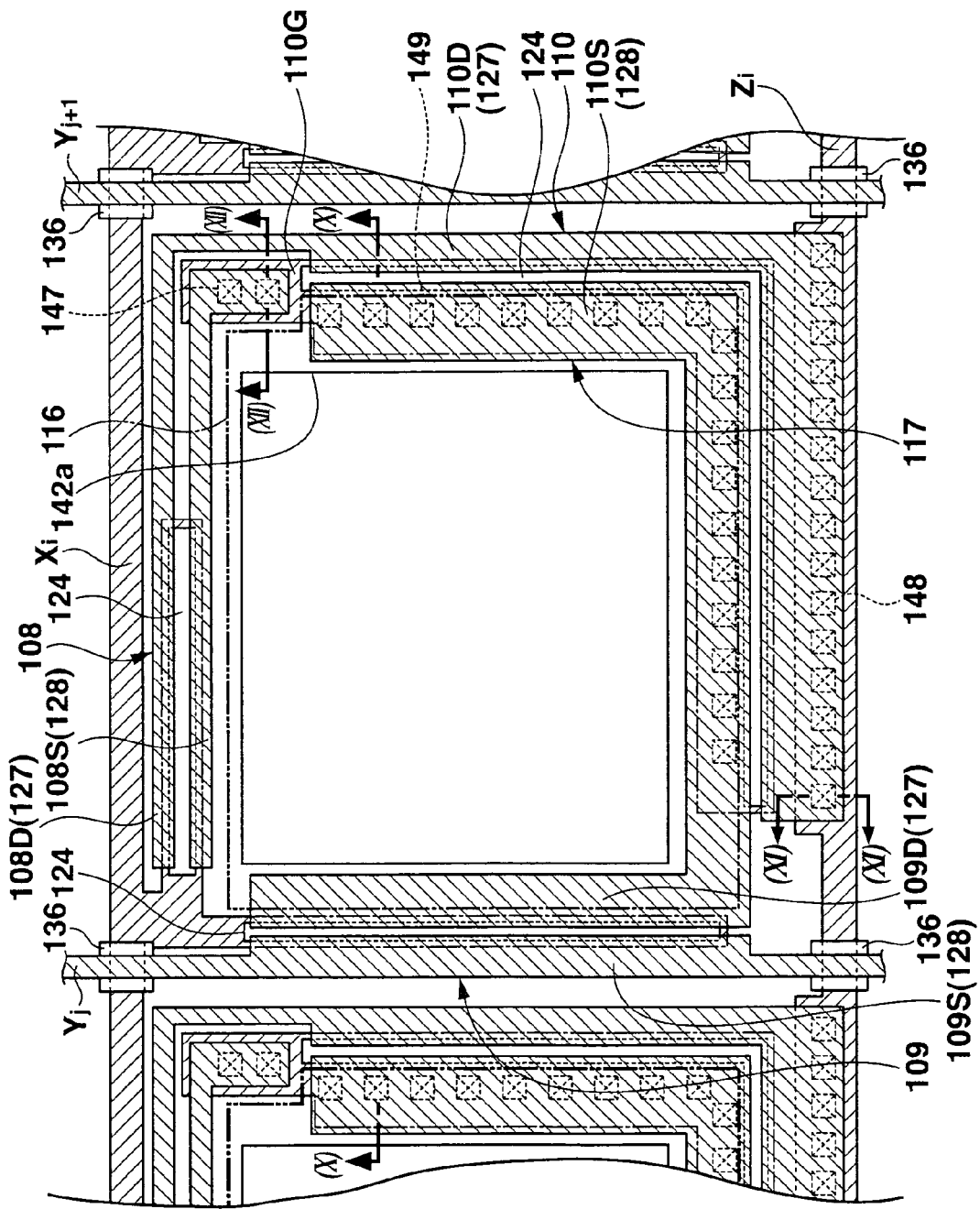
FIG. 9 is a plan view of a pixel driving circuit $D_{i,j}$ in a pixel $P_{i,j}$.
Figure 10:
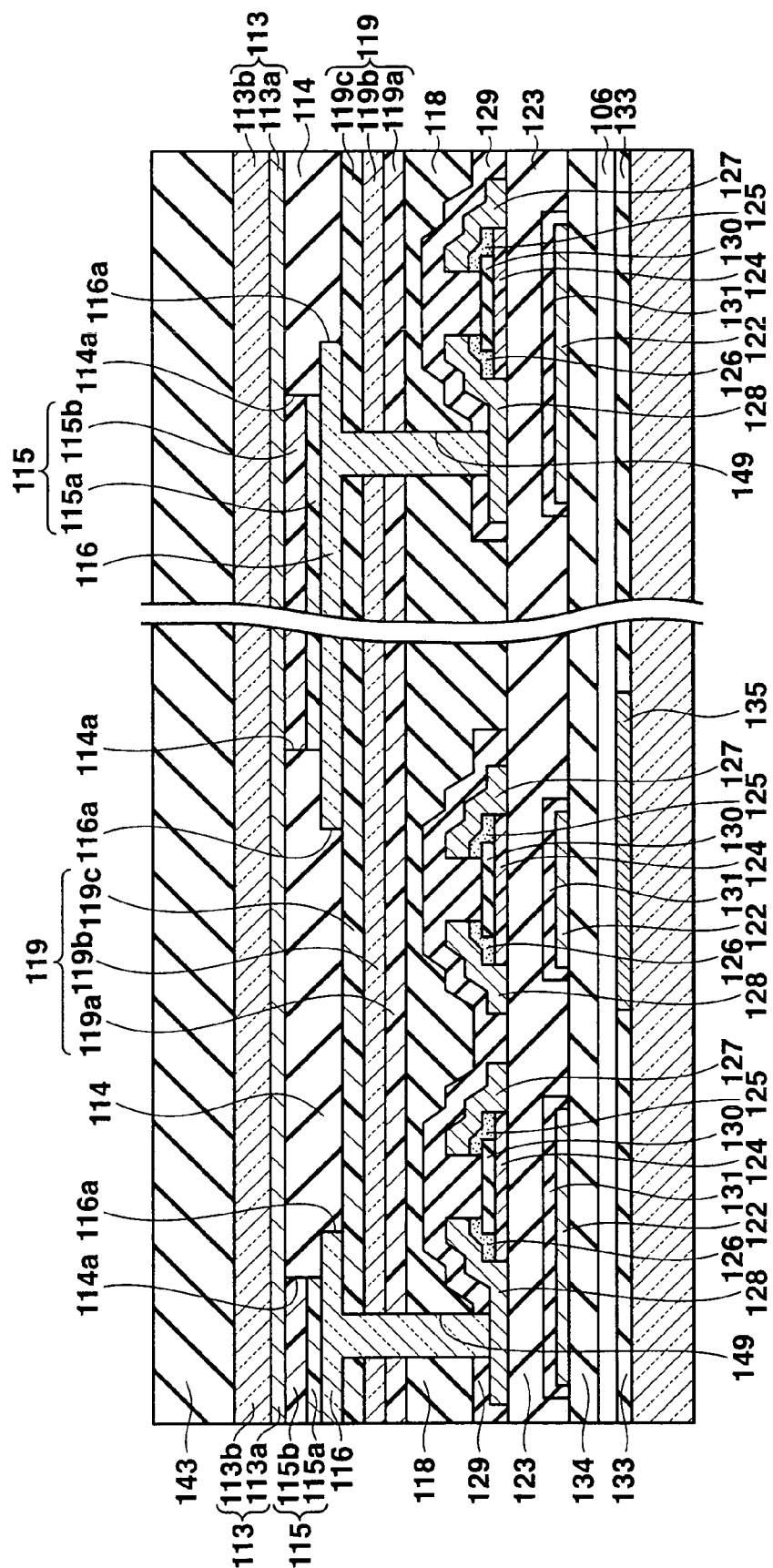
FIG. 10 is a sectional view taken along a line (X)-(X) in FIG. 9 in the direction of thickness.
Figure 11:
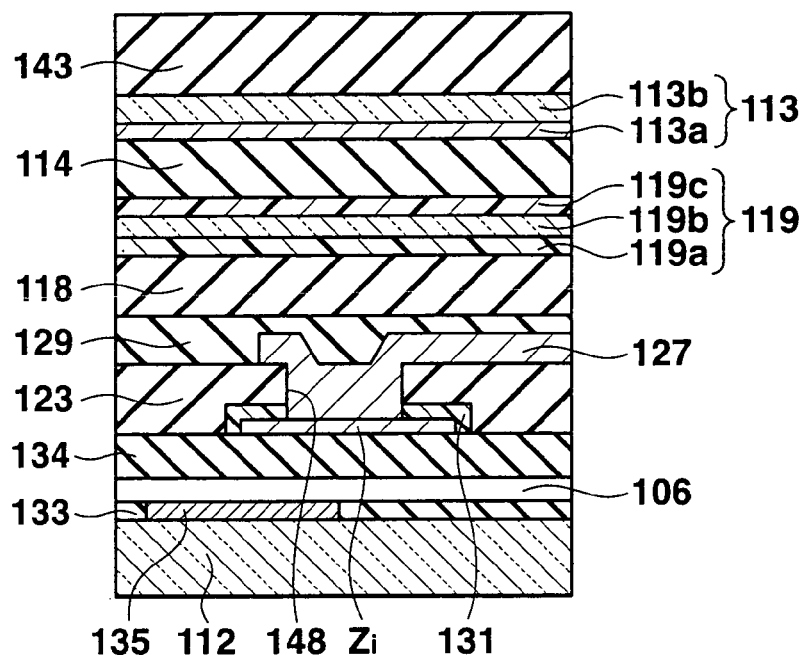
FIG. 11 is a sectional view taken along a line (XI)-(XI) in FIG. 9 in the direction of thickness.
Figure 12:
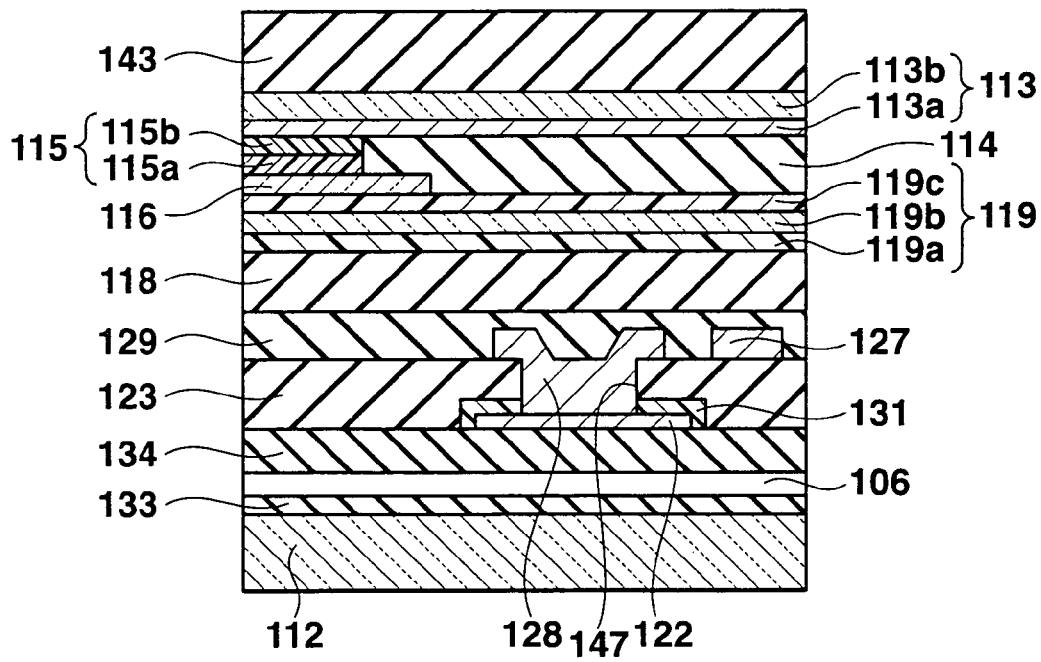
FIG. 12 is a sectional view taken along a line (XII)-(XII) in FIG. 9 in the direction of thickness.

The pixel $P_{i,j}$ will be described here in detail. FIG. 9 is a schematic view showing the pixel driving circuit $D_{i,j}$ in the pixel $P_{i,j}$ viewed from the upper side. FIG. 10 is a sectional view taken along a line (X)-(X) in FIG. 9 in a direction of thickness. FIG. 11 is a sectional view taken along a line (XI)-(XI) in FIG. 9 in a direction of thickness. FIG. 12 is a sectional view taken along a line (XII)-(XII) in FIG. 9 in a direction of thickness. To help understanding, the gate insulating film 123 (to be described later), a first impurity-doped semiconductor film 125, a second impurity-doped semiconductor film 126, a block insulating film 130, and the counter transparent electrode 113 are not at least partially illustrated in FIG. 9.

A gate electrode layer 122 having a predetermined pattern, which serves as the gate electrode 108G of the first transistor 108, the gate electrode 109G of the second transistor 109, and the gate electrode 110G of the third transistor 110, is formed on the interlayer dielectric film 134. The gate electrode layer 122 is formed by patterning the same conductive material layer as the selection scan lines $X_1, X_2, \ldots, X_m$ and voltage source scan lines $Z_1, Z_2, \ldots, Z_m$ at once. The gate electrode layer 122 has a low-resistant material such as chromium, aluminum, copper, titanium, or tungsten or an alloy selected from at least some of them.

An anodic oxide film 131 is formed on the gate electrode layer 122 by anodizing it. The gate insulating film 123 is formed to cover the entire surface of the display unit 107. The gate insulating film 123 is made of a translucent and insulating material such as silicon nitride or silicon oxide. The gate insulating film 123 covers even the selection scan lines $X_1, X_2, \ldots, X_m$ and voltage source scan lines $Z_1, Z_2, \ldots, Z_m$.

Semiconductor films 124 of the first transistor 108, second transistor 109, and third transistor 110 are formed to oppose the gate electrode layers 122 via the gate insulating film 123. The semiconductor film 124 has intrinsic amorphous silicon having a spectral sensitivity from visible light to the infrared wavelength range. The blocking insulating film 130 made of silicon nitride is formed on each semiconductor film 124 to protect its surface from an etchant. The first impurity-doped semiconductor film 125 and second impurity-doped semiconductor film 126 separated from each other are formed on one side and the other side of each blocking insulating film 130. The first impurity-doped semiconductor film 125 is formed to cover one side of the semiconductor film 124 and one side of the blocking insulating film 130. The second impurity-doped semiconductor film 126 is formed to cover the other side of the semiconductor film 124 and the other side of the blocking insulating film 130. The first impurity-doped semiconductor film 125 and second impurity-doped semiconductor film 126 are made of amorphous silicon doped with n-type impurity ions.

A drain electrode layer 127 serving as the drain electrodes 108D, 109D, and 110D is formed on the first impurity-doped semiconductor films 125 of the first transistor 108, second transistor 109, and third transistor 110. A source electrode layer 128 serving as the source electrodes 108S, 109S, and 110S is formed on the second impurity-doped semiconductor films 126 of the first transistor 108, second transistor 109, and third transistor 110. The drain electrode layer 127 and source electrode layer 128 are formed by patterning the same conductive material layer as the current lines $Y_1$ to $Y_n$ (i.e., the current lines $Y_{11}, Y_{21}, \ldots, Y_{T1}, Y_{12}, Y_{22}, \ldots, Y_{T2}, \ldots, Y_{1n}, Y_{2n}, \ldots, Y_{Tn}$) at once. The drain electrode layer 127 and source electrode layer 128 have a low-resistant material such as chromium, aluminum, copper, titanium, or tungsten or an alloy selected from at least some of them and have a function of shielding visible light. With this structure, any external light or light from each organic EL element is suppressed from becoming incident on the semiconductor film 124, first impurity-doped semiconductor film 125, and second impurity-doped semiconductor film 126. The source electrode layer 128 and drain electrode layer 127 are separated and accordingly electrically insulated from each other.

The first transistor 108, second transistor 109, and third transistor 110 may have not the inverted staggered structure but a coplanar structure. At least some of them may be p-channel transistors. The transistors may be made of not amorphous silicon but, e.g., polysilicon. To prevent photo-deterioration of the first transistor 108, second transistor 109, and third transistor 110, the substrate 112 may have a light-shielding effect.

A protective insulating film 129 made of silicon nitride is formed to cover the first transistor 108, second transistor 109, third transistor 110, capacitor 117, selection scan lines $X_1$, $X_2, \ldots, X_m$, current lines $_1, Y_2, \ldots, Y_n$, and voltage source scan lines $Z_1, Z_2, \ldots, Z_m$.

The third transistor 110 having the above structure is an MOSFET having the semiconductor film 124 as a channel region. The first transistor 108 and second transistor 109 have almost the same structure as the above-described third transistor 110. One electrode of the capacitor 117 is also used as the gate electrode layer 122 of the third transistor 110. The other electrode is also used as the source electrode layer 128 of the third transistor 110. The capacitor 117 uses the gate insulating film 123 formed between one electrode and the other electrode as a dielectric. Accordingly, the capacitor 117 functions as a capacitor which stores, as charge data, the gate-to-source potential of the third transistor 110 corresponding to the value of a current flowing between the source and the drain of the third transistor 110. That is, the capacitor 117 stores charge data written as the parasitic capacitance between the gate and the source of the third transistor 110. The capacitor 117 holds the charges stored between the gate and the source of the third transistor 110 so as to supply a current having the same value as in the write between the source and the drain of the third transistor 110 when a predetermined voltage is applied between the source and the drain of the third transistor 110.

The protective insulating film 129 is covered with an insulating planarization film 118 made of, e.g., polyimide. The insulating planarization film 118 functions as a planarization film formed on the entire surface of the display unit 107. Steps generated between the protective insulating films 129 on the first transistor 108, second transistor 109, and third transistor 110 and the protective insulating film 129 on the surface of the interlayer dielectric film 134 are canceled by the insulating planarization film 118. Hence, the insulating planarization film 118 has an almost flat surface. The insulating planarization film 118 is made of a resin (e.g., methacrylate resin, acrylic resin, or epoxy resin). To prevent photo-deterioration of the first transistor 108, second transistor 109, and third transistor 110, the insulating planarization film 118 may have a light-shielding effect by containing a pigment such as carbon black.

An optical interference layer 119 is formed on the insulating planarization film 118 in correspondence with the entire surface of the display unit 107. The optical interference layer 119 is formed by forming, sequentially from the side of the insulating planarization film 118, a reflecting layer 119a which reflects light from the upper side by specular reflection, an optically transparent layer 119b which is set to a predetermined thickness and predetermined refractive index, and a half-reflecting layer 119c which functions as a half-mirror. The optical interference layer 119 is optically designed such that the reflectance to light in the visible light wavelength range increases in the order of transparent layer 119b, half-reflecting layer 119c, and reflecting layer 119a, and the transmittance to light in the visible light wavelength range increases in the order of reflecting layer 119a, half-reflecting layer 119c, and transparent layer 119b. The reflecting layer 119a is a film made of a metal such as Ag, Pt, Cu, or Sn or an alloy thereof and having a smooth surface with a metallic luster. The transparent layer 119b is made of a dielectric such as silicon oxide or titanium oxide. The transparent layer 119b can have a single-layered structure but preferably has a multilayered structure. To make the optical interference layer 119 have an optical thickness corresponding to the light emission wavelength of each organic EL element which emits light of red, green, or blue (to be described later), optical interference layers may be arrayed in a plurality of independent matrices for each pixel or a pixel group of each color when viewed from the upper side. The optical interference layer 119 may have a single-layered structure.

The drain electrode layer 127 of each third transistor 110 is connected to one of the voltage source scan lines $Z_1, Z_2, \ldots, Z_m$ through a plurality of contact holes 148 formed in the gate insulating films 123 and anodic oxide films 131.

The source electrode layer 128 of each first transistor 108 and the gate electrode layer 122 of a corresponding one of the third transistors 110 are connected through a plurality of metal filled contact holes 147 formed in the gate insulating film 123 and anodic oxide film 131.

The organic EL elements $E_{1,1}$ to $E_{m,n}$ are formed on the optical interference layer 119. Each of the organic EL elements $E_{1,1}$ to $E_{m,n}$ has a multilayered structure in which a pixel electrode 116 functioning as, e.g., an anode electrode, an EL layer 115 which causes electroluminescence when a current equal to or more than a threshold value flows, and the counter transparent electrode 113 functioning as, e.g., a cathode electrode are stacked in this order.

The pixel electrode 116 is connected to the source electrode layer 128 of the third transistor 110 through a plurality of metal filled contact holes 149 formed in the insulating planarization film 118, optical interference layer 119, and protective insulating film 129. The pixel electrodes 116 are independently formed while being separated from each other to electrically separate the pixels. A plurality of pixel electrodes 116 are arrayed in a matrix when viewed from the upper side.

On the optical interference layer 119 around the pixel electrode 116, a liquid-repellent film 114 which repels a liquid is formed while overlapping part of an edge portion 116a of the pixel electrode 116. The liquid-repellent film 114 has an opening portion 114a at a position corresponding to the central portion of the pixel electrode 116. The EL layer 115 is deposited in the opening portion 114a. The EL layer 115 is made of a light-emitting material. The EL layer 115 emits light by recombining carriers (holes) injected from the pixel electrode 116 and carriers (electrons) injected from the counter transparent electrode 113. The EL layer 115 of each of the organic EL elements $E_{1,1}$ to $E_{m,n}$ of the pixels $P_{1,1}$ to $P_{m,n}$ emits light of red, green, or blue. The EL layers 115 are arrayed such that the colors are periodically arranged. The EL layers 115 which emit light of the same color may be arrayed in the same column. Alternatively, the red, green, and blue EL layers 115 may be arrayed in a delta array.

The pixel electrode 116 is conductive and transparent to visible light. As long as it functions as an anode, the work function is preferably relatively high. The pixel electrode 116 is made of, e.g., indium oxide, zinc oxide, or tin oxide, or a mixture containing at least one of them (e.g., indium tin oxide (ITO), indium zinc oxide, or cadmium tin oxide (CTO)). When the pixel electrode 116 is formed as a half mirror, the half-reflecting layer 119c can be omitted. In this case, the reflectance to light in the visible light wavelength range increases in the order of transparent layer 119b, pixel electrode 116, and reflecting layer 119a, and the transmittance to light in the visible light wavelength range increases in the order of reflecting layer 119a, pixel electrode 116, and transparent layer 119b. Even in this case, the optical thickness of the transparent layer 119b is an integral multiple of ½ of the dominant wavelength (peak wavelength) of light emitted from the EL layer 115 of the organic EL element. When the optical interference layer 119 is omitted, the pixel electrode 116 need not always be transparent. The pixel electrode 116 preferably has reflective to light in the visible light wavelength range.

The EL layer 115 may appropriately contain either an electron transport substance that transports electrons by an electric field or a hole transport substance that transports holes by an electric field, or both an electron transport substance and a hole transport substance. More specifically, the EL layer 115 may have a three-layered structure including a hole transport layer, a light-emitting layer, and an electron transport layer sequentially formed from the pixel electrode 116. The EL layer 115 may have a two-layered structure sequentially including a hole transport layer and a light-emitting layer or a two-layered structure sequentially including a light-emitting layer and an electron transport layer. The EL layer 115 may have a single-layered structure including a light-emitting layer. Alternatively, the EL layer 115 may have a multilayered structure in which an electron or hole injection layer is inserted between appropriate layers in one of the above layer structures. All the layers included in the EL layer 115 may be made of organic compounds. All the layers included in the EL layer 115 may be made of inorganic compounds. The EL layer 115 may be formed by stacking a layer made of an inorganic compound and a layer made of an organic compound. When all the layers included in the EL layer 115 are made of inorganic compounds, an inorganic EL element is formed in place of an organic EL element. When the EL layer 115 includes a layer of an organic compound, an organic EL element is formed.

When the EL layer 115 is made of a low molecular weight organic material or an inorganic substance, the EL layer 115 can be formed by epitaxial growth such as deposition or sputtering. When the EL layer 115 is made of, e.g., a polymer organic material, an organic compound containing liquid containing a polymer organic material, which is formed on the display unit 107 by wet film formation, repels the surface of the liquid-repellent film 114. Hence, no film is formed on the liquid-repellent film 114. Instead, a film can selectively be formed in the opening portion 114a corresponding to each of the pixels $P_{1,1}$ to $P_{m,n}$, i.e., on each pixel electrode 116. The organic compound containing liquid is a liquid containing an organic compound as the material of the EL layer 115 or its precursor. This liquid may be a solution prepared by dissolving, as a solute, the organic compound as the material of the EL layer 115 or its precursor in a medium. Alternatively, the liquid may be a dispersion prepared by dispersing the organic compound as the material of the EL layer 115 or its precursor in a dispersion medium.

The light-emitting layer of the EL layer 115 contains a light-emitting material. As the light-emitting material, a polymer-based material is used. Examples of polymer-based materials are polycarbazole-, polyparaphenylene-, polyallylenevinylene-, polythiophene-, polyfluorene-, polysilane-, polyacetylene-, polyaniline-, polypyridine-, polypyridinevinylene-, and polypyrrole-based materials. Examples of polymer materials are a polymer or copolymer of the monomer or oligomer of one of the above polymer materials (polymers), a polymer or copolymer of the derivative of the monomer or oligomer, or a polymer or copolymer prepared by polymerizing a monomer having an oxazole (oxandiazole, triazole, or diazole) or triphenylamine skeleton. The monomers of these polymers include monomers and precursor polymers which form the above-described compounds upon receiving heat, pressure, UV, or electron beam. A disconjugate unit which bonds the monomers may be introduced.

Detailed examples of the polymer materials are polyfluorene, polyvinylcarbazole, polydodecylthiophene, polyethylenedioxythiophene, denatured polystyrene sulfonate dispersoid, poly-9.9-dialkyl fluorene, poly(thienylene-9.9-dlalkyl fluorene), poly(2.5-dialkyl paraphenylene-thienylene), (dialkyl: R=C1 to C20), polyparaphenylenevinylene, poly(2-methoxy-5-(2'-ethyl-hexyloxy)^paraphenylenevinyl ene), poly(2-methoxy-5-(2'-ethyl-pentyloxy)-paraphenylenevinylene), poly(2.5-dimethyl-paraphenylenevinylene), poly(2.5-thienylenevinylene), poly(2.5-dimethoxyparaphenylenevinylene), and poly(1.4-paraphenylenevinylenecyanovinylene).

The material is not limited to the above-described polymer materials. The light-emitting layer may be formed by depositing a low molecular weight material. A low molecular weight material having a certain characteristic may be dissolved in a medium and applied. A low molecular weight material may be dispersed in a polymer as a dopant. Various kinds of polymers including known general-purpose polymers can be used as the polymer in which a low molecular weight material is polymer-dispersed.

The EL layer 115 is formed by wet film formation and has a two-layered structure in which a hole transport layer 115a made of PEDOT (polythiophene) as a conductive polymer and PSS (polystyrene sulfonate) as a dopant, and a light-emitting layer 115b made of a polyfluorene-based light-emitting material are stacked in this order. When the EL layer 115 is formed by wet film formation, preferably, a lyophilic film having a characteristic (to be referred to as a "lyophilic effect" hereinafter) representing that the film surface wets well with a liquid at a contact angle of 40° or less is formed on the pixel electrode 116, and in this state, an organic compound containing liquid is applied to the lyophilic film.

The optical thickness (a layer thickness d×refractive index n) of the transparent layer 119b of the optical interference layer 119 is an integral multiple of ½ of the dominant wavelength (peak wavelength) of light emitted from the EL layer 115. Accordingly, the optical interference layer 119 has a resonant structure. More specifically, when light emitted from the EL layer 115 and, more particularly, light in the wavelength range near the dominant wavelength enters the optical interference layer 119, a light component having the dominant wavelength resonates by repeating reflection between the reflecting layer 119a and the half-reflecting layer 119c. Hence, the intensity of light emerging from the optical interference layer 119 increases. On the other hand, even when interference occurs while, of external light that enters the optical interference layer 119, a light component except the resonant dominant wavelength reflects between the reflecting layer 119a and the half-reflecting layer 119c, the phase does not coincide with the optical path length by the optical thickness of the transparent layer 119b. Since the light is gradually attenuated, it rarely emerges outside from the optical interference layer 119. The optical interference layer 119 can amplify the light emitted from the EL layer 115 and output light in a relatively wide wavelength range as light in a narrower wavelength range. Hence, the color purity of each color can be increased. In addition, glare caused by internal reflection of external light can be suppressed. For this reason, dark display or black display can be executed, and therefore, the contrast ratio can be increased. The optical thickness of the transparent layer 119b preferably changes depending on the wavelength range of the color of emitted light of each pixel. When the pixels should emit light of R (red), G (green) having a shorter wavelength than red, and B (blue) having a shorter wavelength than green, the optical thicknesses are set to satisfy optical thickness of transparent layer 119b of pixel R>optical thickness of transparent layer 119b of pixel G>optical thickness of transparent layer 119b of pixel B.

The liquid-repellent film 114 (e.g., a fluoroplastic film or a reactive silicon film) having a characteristic (to be referred to as "liquid repellency" hereinafter) representing that the film surface repels a liquid and wets with it at a contact angle of 50° or more is formed on the optical interference layer 119 around each EL layer 115. When the liquid-repellent film 114 is formed into a mesh shape between the EL layers 115 when viewed from the upper side, a plurality of surrounded regions surrounded by the liquid-repellent film 114 are arrayed in a matrix, and the EL layers 115 are formed in the surrounded regions. As shown in FIG. 10, part of the liquid-repellent film 114 may overlap part of the edge of the pixel electrode 116. However, they need not always overlap. Especially, the EL layer 115 is formed as a very thin film. When the EL layer 115 is formed by wet film formation, and the organic compound containing liquid one-sidedly flows to adjacent pixels, some pixels obtain thin EL layers 115. This may cause short circuit between the pixel electrode 116 and the counter transparent electrode 113. However, the liquid-repellent film 114 which partitions the adjacent pixel electrodes 116 can prevent the organic compound containing liquid from flowing to adjacent pixels. In addition, when adjacent pixels are made of different materials which emit light of different colors, the liquid-repellent film 114 can prevent any decrease in purity of the color of emitted light of each pixel, which may be caused when the organic compound containing liquids of the adjacent pixels mix each other. The liquid-repellent film 114 may have a structure in which a material layer made of a resin or the like, which does not exhibit liquid repellency, is used as a dam that stores the organic compound containing liquid for each pixel, and a layer having liquid repellency may be formed on the exposed surface of the material layer. When the EL layer 115 is formed by epitaxial growth, the liquid-repellent film 114 need not be formed.

The counter transparent electrode 113 is formed as one common electrode of the organic EL elements $E_{1,1}$ to $E_{m,n}$ of all the pixels $P_{1,1}$ to $P_{m,n}$. The counter transparent electrode 113 is formed on the entire surface of the display unit 107 when viewed from the upper side and has a multilayered structure having an electron injection layer 113a and a transparent conductive layer 113b sequentially formed from the side of the EL layers 115. The electron injection layer 113a is so thin as to pass light and is made of a material having a relatively low work function (e.g., a single metal such as magnesium, calcium, lithium, or barium, or a rare earth metal, or an alloy containing at least one of these single substances). The electron injection layer 113a has a thickness less than the visible light wavelength range and is 10 to 200 nm. The transparent conductive layer 113b is conductive and transparent to visible light. The transparent conductive layer 113b is made of, e.g., indium oxide, zinc oxide, or tin oxide, or a mixture containing at least one of them (e.g., indium tin oxide (ITO), indium zinc oxide, or cadmium tin oxide (CTO)). The resistivity of such a material is about $100 \times 10^{-6}$ Ωcm to $1,000 \times 10^{-6}$ Ωcm. The transparent conductive layer 113b is preferably thin to increase the light transmittance of the counter transparent electrode 113. The thickness of the transparent conductive layer 113b is 50 to 1,000 nm. As described above, the counter transparent electrode 113 passes at least part of the light emission wavelength range of the EL layer 115. The display apparatus 101 has a so-called top emission structure which outputs light from the EL layer 115 from the side of the counter transparent electrode 113. The counter transparent electrode 113 may be divided into two or more parts. The counter transparent electrode 113 may include a plurality of stripe-shaped electrodes which are commonly connected to pixels adjacent in the column direction. Alternatively, the counter transparent electrode 113 may include a plurality of stripe-shaped electrodes which are commonly connected to pixels adjacent in the row direction.

A sealing film 143 is formed on the counter transparent electrode 113 to cover the entire region of the display unit 107. The sealing film 143 has a characteristic that passes light and is made of a transparent resin (e.g., methacrylic resin, acrylic resin, or epoxy resin). The upper portion of the sealing film 143 may hermetically be sealed by a glass substrate, as needed.

The pixel electrodes 116 do not overlap the selection scan lines $X_1$ to $X_m$, current lines $Y_1$ to $Y_n$ (current lines $Y_{11}$, $Y_{21}, \ldots, Y_{T1}, Y_{12}, Y_{22}, \ldots, Y_{T2}, \ldots, Y_{1n}, Y_{2n}, \ldots, Y_{Tn}$), and voltage source scan lines $Z_1$ to $Z_m$ when viewed from the upper side to suppress any delay of the current flowing to the wiring lines caused by the parasitic capacitance between the pixel electrodes 16 and the wiring lines. However, if the insulating planarization film 118 is so thick as to sufficiently relax the parasitic capacitance, the pixel electrodes 116 may overlap the wiring lines. Accordingly, the EL layers 115 on the pixel electrodes 116 can also be made large. Hence, the display area can be increased, or the display area ratio in the display unit 107 can be made high.

A method of manufacturing the display apparatus 101 will be described next.

Step of Manufacturing Control Circuits Which Control Display Unit 107

The wiring lines $L_{X1}, L_{X2}, \ldots, L_{Xm}$, wiring lines $L_{Y11}, L_{Y12}, \ldots L_{Y1n}$, wiring lines $L_{Y21}, L_{Y22}, \ldots L_{Y2n}$, wiring lines $L_{YT1}, L_{YT2}, \ldots L_{YTn}$, and wiring lines $L_{Z1}, L_{Z2}, \ldots L_{Zm}$ are formed on the substrate 112 having a flat plate shape. In addition, the wiring lines 151a, 151b, and 151c, wiring lines 152a, 152b, and 152c, and wiring lines 153a, 153b, and 153c are formed on the substrate 112. These wiring lines may be formed at once by patterning a single conductive film.

The controller 106 is connected to the terminals of the wiring lines 151a, 151b, and 151c, wiring lines 152a, 152b, and 152c, and wiring lines 153a, 153b, and 153c.

The first selection scan driver 103a, second selection scan driver 103b, and Sth selection scan driver 103c are connected to the wiring lines $L_{X1}, L_{X2}, \ldots L_{Xm}$ and wiring lines 151a, 151b, and 151c.

The first voltage source driver 104a, second voltage source driver 104b, and Sth voltage source driver 104c are connected to the wiring lines $L_{Z1}, L_{Z2}, \ldots L_{Zm}$, and wiring lines 153a, 153b, and 153c.

The first data driver 105a, second data driver 105b, and Tth data driver 105c are connected to the wiring lines $L_{Y11}, L_{Y12}, \ldots L_{Y1n}$, wiring lines $L_{Y21}, L_{Y22}, \ldots L_{Y2n}$, wiring lines $L_{YT1}, L_{YT2}, \ldots L_{YTn}$, and wiring lines 152a, 152b, and 152c.

The space between the plurality of connection terminals of the first selection scan driver 103a, second selection scan driver 103b, Sth selection scan driver 103c, first voltage source driver 104a, second voltage source driver 104b, Sth voltage source driver 104c, first data driver 105a, second data driver 105b, and Tth data driver 105c is filled with a filler 133 so that the drivers are fixed to the substrate 112.

The interlayer dielectric film 134 which also serves as a planarization film is formed on the entire region of the substrate 112. Contact holes are formed in the interlayer dielectric film 134 in correspondence with the terminal portions $Tr_1$ of the wiring lines $L_{X1}, L_{X2}, \ldots L_{Xm}$, wiring lines $L_{Y11}, L_{Y12}, \ldots _{Y1n}$, wiring lines $L_{Y21}, L_{Y22}, \ldots L_{Y2n}$, wiring lines $L_{YT1}, L_{YT2}, \ldots L_{YTn}$, and wiring lines $L_{Z1}, L_{Z2}, \ldots L_{Zm}$.

Step of Manufacturing Display Unit 107

The first transistor 108, second transistor 109, and third transistor 110 are formed on the interlayer dielectric film 134 in correspondence with each pixel. In addition, the selection scan lines $X_1, X_2, \ldots, X_m$, current lines $Y_{11}, Y_{21}, \ldots, Y_{T1}, Y_{12}, Y_{22}, \ldots, Y_{T2}, \ldots, Y_{1n}, Y_{2n}, \ldots Y_{Tn}$, and voltage source scan lines $Z_1, Z_2, \ldots, Z_m$ are formed on the interlayer dielectric film 134.

The terminal portions $Tr_2$ of the selection scan lines $X_1, X_2, \ldots, X_m$ are respectively connected to the terminal portions $Tr_1$ of the wiring lines $L_{X1}, L_{X2}, \ldots, L_{Xm}$ through the contact holes formed in the interlayer dielectric film 134. The terminal portions $Tr_2$ of the current lines $Y_{11}, Y_{12}, \ldots, Y_{1n}$ are respectively connected to the terminal portions $Tr_1$ of the wiring lines $L_{Y11}, L_{Y12}, \ldots L_{Y1n}$ through the contact holes formed in the interlayer dielectric film 134. The terminal portions $Tr_2$ of the current lines $Y_{21}, Y_{22}, \ldots, Y_{2n}$ are respectively connected to the terminal portions $Tr_1$ of the wiring lines $L_{Y21}, L_{Y22}, \ldots L_{Y2n}$ through the contact holes formed in the interlayer dielectric film 134. The terminal portions $Tr_2$ of the current lines $Y_{T1}, Y_{T2}, \ldots, Y_{Tn}$ are respectively connected to the terminal portions $Tr_1$ of the wiring lines $L_{YT1}, L_{YT2}, \ldots L_{YTn}$ through the contact holes formed in the interlayer dielectric film 134. The terminal portions $Tr_2$ of the voltage source scan lines $Z_1, Z_2, \ldots, Z_m$ are respectively connected to the terminal portions $Tr_1$ of the wiring lines $L_{Z1}, L_{Z2} \ldots L_{Zm}$ through the contact holes formed in the interlayer dielectric film 134.

The transistors 108 to 110 and the wiring lines $X_1$ to $X_m$, $Y_1$ to $Y_n$, and $Z_1$ to $Z_m$ are selectively covered with the protective insulating film 129 made of silicon nitride or silicon oxide. The insulating planarization film 118 made of a resin such as polyimide is deposited on the protective insulating film 129 in correspondence with the entire region of the display unit 107. Then, the reflecting layer 119a, transparent layer 119b, and half-reflecting layer 119c are sequentially formed to form the optical interference layer 119.

The plurality of contact holes 149 which communicate with the source electrode layer 128 of the third transistor 110 of each pixel are formed in the optical interference layer 119, insulating planarization film 118, and protective insulating film 129 by photolithography. An opening portion 118a of the insulating planarization film 118 forms part of the contact hole 149. When the height of the insulating planarization film 118 is more than the thickness of the pixel electrode 116, the opening portion 118a may be filled with a conductive material before formation of the pixel electrodes 116.

An optically transparent conductive film (e.g., an ITO film) is formed on the entire surface of the display unit 107 by epitaxial growth. A resist is formed in a matrix on the conductive film by the photoresist process. The conductive film is processed by etching or the like by using the resist as a mask. After that, the resist is removed. The remaining conductive film becomes the pixel electrode 116 which is electrically connected to the source electrode layer 128 of the third transistor 110 through the contact holes 149. The plurality of pixel electrodes 116 can be patterned in a matrix. Each of the plurality of pixel electrodes 116 is arranged in a corresponding display region surrounded by the first transistor 108, second transistor 109, and third transistor 110 of each pixel. The pixel electrodes 116 are also electrically isolated from each other. The edge portion 116a is formed along the first transistor 108, second transistor 109, and third transistor 110.

The pixel electrodes 116 directly overlap the optical interference layer 119 when viewed from the upper side. If an etchant for the transparent conductive film may erode the optical interference layer 119, an insulating layer having a high etching resistance may be inserted between the optical interference layer 119 and the pixel electrodes 116.

The liquid-repellent film 114 having the opening portions 114a to which the central portions of the pixel electrodes 116 are exposed is formed into a mesh shape on the display unit 107. At this time, the edges which define the opening portion 114a of the liquid-repellent film 114 cover the edge portions 116a of the pixel electrodes 116. The liquid-repellent film 114 may be formed by photolithography and etching. The liquid-repellent film 114 may be a fluoroplastic film such as a silazane compound which has Si—N—Si bonds and a functional group containing fluorine in which a functional group containing fluorine is bonded to N or/and Si, or a reactive silicon film.

The EL layers 115 may be formed in the following way. The liquid-repellent film 114 is formed on the entire surface of the display unit 107. A photocatalyst which generates active species that promote chemical reaction to eliminate the liquid repellency upon receiving light in a predetermined wavelength range is placed on the liquid-repellent film 114 on the upper surface of each pixel electrode 116. The light in the predetermined wavelength range is caused to become incident from the upper surface of the photocatalyst to impart a lyophilic effect to the liquid-repellent film 114 on the pixel electrode 116 where the EL layer 115 should be formed. The EL layer 115 is formed on the liquid-repellent film 114 by a method to be described later. More specifically, a liquid containing silazane compound is applied thin to the entire surface of the display unit 107. After the silazane compound is converted into a polymer, the liquid is dried, and a photocatalyst such as titanium oxide is placed on the pixel electrodes 116. The photocatalyst is selectively irradiated with UV rays to eliminate fluorine or a functional group containing fluorine from the silazane-based polymer on the pixel electrodes 116 to eliminate the liquid repellency of the liquid-repellent film 114. The liquid repellency of the liquid-repellent film 114 located between the pixel electrodes 116 may be maintained without irradiating it with UV rays. The liquid-repellent film 114 having no liquid repellency is an insulating film. However, the liquid-repellent film 114 formed on the pixel electrode 116 does not so greatly impede injection of carriers such as holes or electrons because the liquid-repellent film 114 is very thin. The liquid-repellent film 114 may be formed as a base which is made of polyimide and has the opening portion 114a as a sidewall, and a liquid-repellent material such as a fluorine-based material may be applied thin to the surface of the base.

The EL layers 115 are formed on the pixel electrodes 116 exposed by the opening portions 114a of the liquid-repellent film 114. In patterning the EL layers 115, they may selectively be deposited by using a droplet ejection nozzle (inkjet nozzle) which ejects a liquid containing the material of the EL layers 115. More specifically, the nozzle is made to oppose the substrate 112 placed on a stage. The nozzle is moved parallel to the substrate 112, and when the nozzle is located on a surrounded region, it ejects the organic compound containing liquid. Accordingly, the EL layers 115 can be formed to overlap the pixel electrodes 116 when viewed from the upper side.

When the EL layer 115 includes the hole transport layer 115a and light-emitting layer 115b, a nozzle for the hole transport layer first ejects a liquid containing the material of the hole transport layer 115a as a droplet to each region surrounded by the opening portion 114a of the liquid-repellent film 114. After the liquid dries, and thus the hole transport layer 115a is formed, a nozzle for the light-emitting layer 115b of narrow sense ejects a liquid containing the material of the light-emitting layer 115b as a droplet to each region surrounded by the opening portion 114a of the liquid-repellent film 114. The liquid dries, and the light-emitting layer 115b is formed. Even when the droplet containing the material of the hole transport layer 115a or light-emitting layer 115b drops to the edge of the liquid-repellent film 114, the droplet is repelled by the liquid-repellent film 114 and falls into the opening portion (pixel electrode 116) surrounded by the liquid-repellent film 114. If the liquid-repellent film 114 can sufficiently repel the droplet, the EL layers 115 may be formed by printing. At this time, the liquid-repellent film 114 partitions the liquid containing the material of the EL layers 115 between adjacent pixels even when the accuracy of the printing technique is not so high as photolithography. Hence, pixels with a fine pitch can be formed.

A metal mask having a mesh shape may be formed on the substrate 112 while exposing the pixel electrodes 116. The EL layers 115 may be formed in a matrix by executing epitaxial growth in this state. If the hole transport layers 115a of the pixels can be made of the same material regardless of the colors of light emitted by the EL layers 115, the display unit 107 may wholly be dipped in a liquid containing the material of the hole transport layer 115a. Accordingly, the EL layers 115 can selectively be formed on the pixel electrodes 116 by the patterned liquid-repellent film 114. Instead of forming the liquid-repellent film 114, the hole transport layer 115a may be formed as a continuous layers across the pixels by wholly dipping the display unit 107 in the liquid containing the material of the hole transport layer 115a.

A single metal such as magnesium, calcium, lithium, or barium, or a rare earth metal, or an alloy containing at least one of these single substances is formed on the entire surface of the display unit 107 to a thickness of 10 to 200 nm by sputtering or deposition in an inert gas atmosphere such as argon or in a reduced pressure atmosphere at 1 Torr or less, thereby forming the electron injection layer 113a. Subsequently, a material selected from indium tin oxide (ITO), indium zinc oxide, and cadmium tin oxide (CTO) is formed on the entire surface of the display unit 107 to a thickness of 50 to 200 nm by sputtering or deposition such as CVD, thereby forming the transparent conductive layer 113b on the electron injection layer 113a.

The transparent sealing film 143 prepared by inserting thin metal films and inorganic compound layers between a plurality of resin films is formed on the display unit 107. At this time, the sealing film 143 preferably covers all the components in the display unit 107 as much as possible, except components extending outside the region of the display unit 107, such as the terminals of the selection scan lines $X_1$ to $X_m$, current lines $Y_1$ to $Y_n$, and voltage source scan lines $Z_1$ to $Z_m$ and the terminals of the counter transparent electrode 113 of the organic EL elements $E_{1,1}$ to $E_{m,n}$. To smoothen the surface of the sealing film 143 to efficiently output light from the EL layers 115, the surface of the sealing film 143 may be subjected to chemical polishing, mechanical polishing, or chemical mechanical polishing. In addition, a counter substrate opposing the substrate 112 may be arranged above the sealing film 143 to arrange the display unit 107 between the substrates.

In the display apparatus 101 manufactured in the above way, the selection scan driver 103, voltage source driver 104, data driver 105, and controller 106 control the pixel driving circuits $D_{1,1}$ to $D_{m,n}$ of the pixels $P_{1,1}$ to $P_{m,n}$ through the selection scan lines $X_1$ to $X_m$, current lines $Y_1$ to $Y_n$, and voltage source scan lines $Z_1$ to $Z_m$ to cause the organic EL elements $E_{1,1}$ to $E_{m,n}$ to appropriately emit light so that the light emerges outside from the side of the counter transparent electrode 113. Hence, the display surface is formed on the side of the counter transparent electrode 113. A user who opposes the side of the counter transparent electrode 113 can see the displayed contents.

The present invention is not limited to the above-described embodiment and modifications, and various changes and modifications can be made without departing from the spirit and scope of the present invention.

In the above description, as an example of two-dimensional array of the plurality of pixel electrode 116, they are arrayed in a matrix. Instead, the plurality of pixel electrodes 116 may be arranged in a delta array in which triangles are formed by the vertices of adjacent R, G, and B pixels. Alternatively, the pixel electrodes 116 may be arranged in a honeycomb by forming hexagonal pixels. Pixel groups each including a plurality of pixels which emit light of the same color may be arrayed along the column direction such that each pixel group is arranged adjacent to pixel groups including a plurality of pixels which emit light of different colors in the row direction.

The circuit arrangement of the pixel driving circuit $D_{i,j}$ will be described next in detail.

For the descriptive convenience, the current lines $Y_{11}, Y_{21}, \ldots, Y_{T1}, Y_{12}, Y_{22}, \ldots, Y_{T2}, \ldots, Y_{1n}, Y_{2n}, \ldots, Y_{Tn}$ will be expressed as current lines $Y_1$ to $Y_n$.

A voltage $V_{NSE}$ applied to the voltage source scan line $Z_i$ during a nonselection period is equal to or higher than the reference potential $V_{SS}$. A voltage $V_{SE}$ applied to the voltage source scan line $Z_i$ during a selection period is equal to or lower than the reference potential $V_{SS}$. The reference potential $V_{SS}$ is, e.g., ground potential.

As shown in FIG. 6, the selection scan driver 103 is connected to the selection scan lines $X_1$ to $X_m$ of the display unit 107. The selection scan driver 103 is a so-called shift register. The selection scan driver 103 sequentially outputs a scan signal to the selection scan lines $X_1$ to $X_m$ in the order from $X_1$ to $X_m$ (the selection scan line $X_1$ follows the selection scan line $X_m$) in accordance with the control signals φs output from the controller 106, thereby sequentially selecting the first transistors 108 and second transistors 109 connected to the selection scan lines $X_1$ to $X_m$. More specifically, when the first transistors 108 and second transistors 109 are n-channel transistors, the selection scan driver 103 selectively applies an ON voltage $V_{ON}$ of high level (sufficiently higher than the reference potential $V_{SS}$) or an OFF voltage $V_{OFF}$ of low level (equal to or lower than the reference potential $V_{SS}$) to the selection scan lines $X_1$ to $X_m$. During a selection period when the selection scan line $X_i$ of the selection scan lines $X_1$ to $X_m$ is selected, the selection scan driver 103 outputs a pulse of the ON voltage VON to the selection scan line $X_i$. Accordingly, the second transistors 109 and third transistors 110 (all the second transistors 109 and third transistors 110 in the pixel driving circuits $D_{i,1}$ to $D_{i,n}$) connected to the selection scan line $X_i$ are turned on. During a nonselection period except the selection period, the OFF voltage $V_{OFF}$ is applied to the selection scan line $X_i$ so that the second transistors 109 and third transistors 110 are turned off. The selection periods of the selection scan lines $X_1$ to $X_m$ preferably do not overlap each other. However, if a plurality of pixels P connected to the current line $Y_j$ of the same column should emit light of the same gray level, settings may be done such that the selection periods of the selection scan lines $X_1$ to $X_m$ are synchronized, and the selection periods of the voltage source scan lines $Z_1$ to $Z_m$ are synchronized.

The voltage source driver 104 is connected to the voltage source scan lines $Z_1$ to $Z_m$ of the display unit 107. The voltage source driver 104 is a so-called shift register. The voltage source driver 104 sequentially outputs a pulse signal to the voltage source scan lines $Z_1$ to $Z_m$ in the order from $Z_1$ to $Z_m$ (the voltage source scan line $Z_1$ follows the voltage source scan line $Z_m$) in accordance with the control signals φe output from the controller 106. More specifically, the voltage source driver 104 applies to the voltage source scan lines $Z_1$ to $Z_m$ a selection voltage (e.g., 0 [V] when the reference potential is ground potential) equal to or lower than the reference potential $V_{SS}$ at a predetermined period. More specifically, during a selection period when the selection scan line $X_i$ of the selection scan lines $X_1$ to $X_m$ is selected, the voltage source driver 104 applies a selection voltage of low level to the voltage source scan line $Z_i$. On the other hand, during a nonselection period, the voltage source driver 104 applies the nonselection voltage $V_{NSE}$ of level higher than the reference potential $V_{SS}$ to the voltage source scan line $Z_i$. The nonselection voltage $V_{NSE}$ may be a negative voltage if it is higher than the reference potential $V_{SS}$. However, the nonselection voltage $V_{NSE}$ has a sufficiently large value such that a drain-to-source voltage $V_{DS}$ of the third transistor 110 reaches a saturated area. The saturation voltage will be described later in detail.

The controller 106 outputs the control signals φs, control signals φe, and control signals φd to the selection scan driver 103, voltage source driver 104, and data driver 105, respectively, in accordance with input image data.

The data driver 105 is a current sink driver which draws storage currents toward the data driver 105 from the current lines $Y_1$ to $Y_n$ upon receiving the control signals from the controller 106. That is, the data driver 105 has a current sink circuit and generates storage currents in the current lines $Y_1$ to $Y_n$, as indicated by arrows a in FIG. 13. The value of a display current which flows when the organic EL elements $E_{1,1}$ to $E_{m,n}$ emit light during the nonselection period equals that of the storage current. During the selection period, the data driver 105 causes each capacitor 117 to accumulate charges in a magnitude corresponding to the value of the storage current as current data.

The operation principle in the pixels $P_{1,1}$ to $P_{m,n}$ when the data driver 105 supplies storage currents having predetermined values to the current lines $Y_1$ to $Y_n$ will be described.

Figure 15:
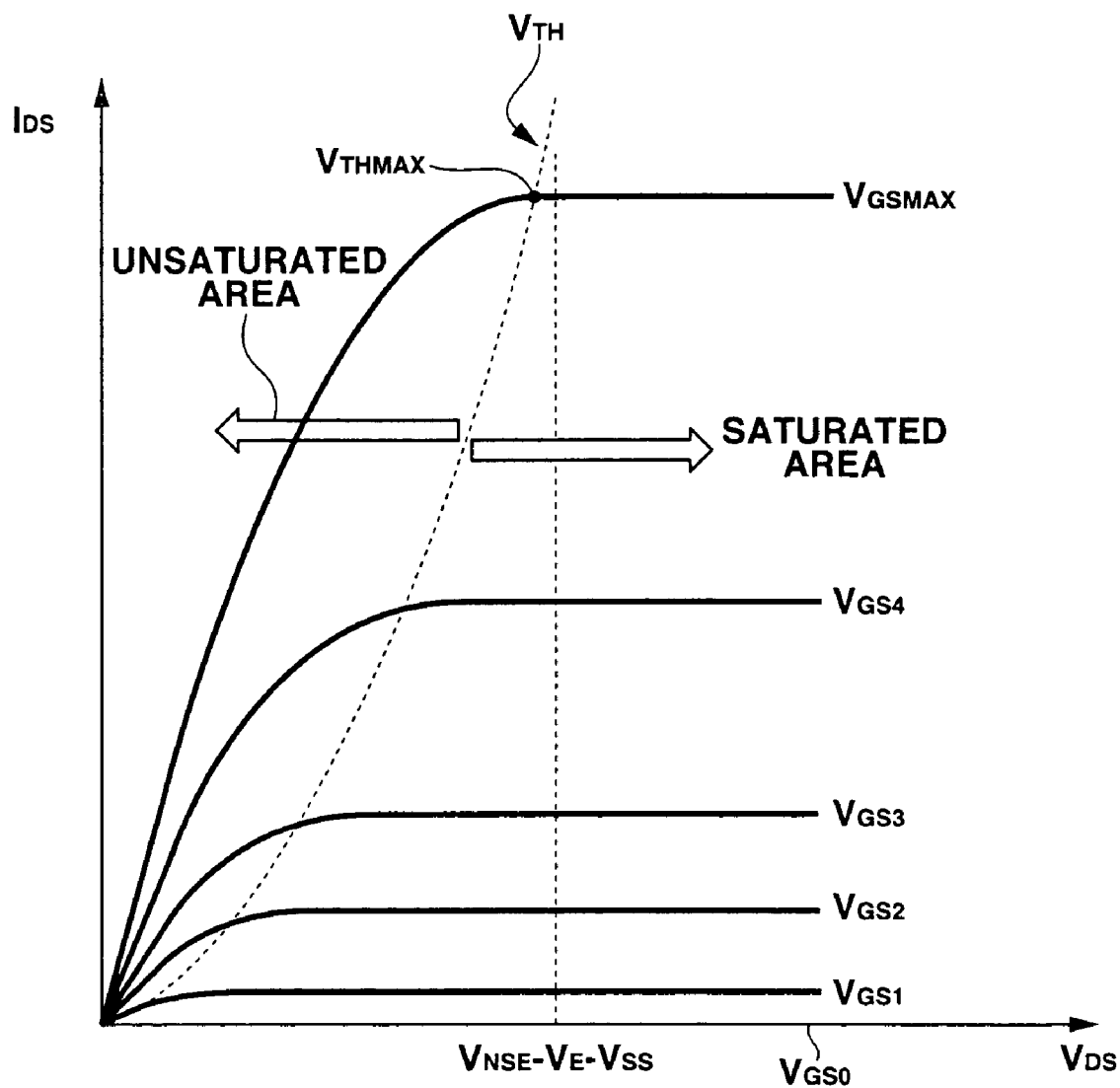
FIG. 15 is a graph showing the relationship between the current which flows to an NMOSFET connected in series with a light-emitting element of the display apparatus and the voltage applied to the MOSFET.

FIG. 15 is a graph showing the current vs. voltage characteristic of the third transistor 110 as an NMOSFET. Referring to FIG. 15, the abscissa represents the drain-to-source voltage value, and the ordinate represents the drain-to-source current value. In the unsaturated area of a FET, i.e., in the region where the drain-to-source voltage value $V_{DS}$ is smaller than a drain saturation threshold voltage $V_{TH}$ corresponding to a gate-to-source voltage value $V_{GS}$, when the gate-to-source voltage value $V_{GS}$ is constant, a source-to-drain current value $V_{DS}$ increases as the drain-to-source voltage value $V_{DS}$ increases. In addition, in the saturated area shown in FIG. 15, i.e., in the region where the drain-to-source voltage value $V_{DS}$ is equal to or larger than the drain saturation threshold voltage $V_{TH}$ corresponding to the gate-to-source voltage value $V_{GS}$, when the gate-to-source voltage value $V_{GS}$ is constant, the source-to-drain current value $I_{DS}$ is almost constant.

The source-to-drain current value $I_{DS}$ in the saturated area is given by $$I_{DS} = \mu C_0 Z (V_{GS} - V_{TH})^2 / 2L \quad (1)$$

In equation (1), μ is the mobility of carriers (electrons), $C_0$ is the capacitance using the gate insulating film of the MOS structure as a dielectric, Z is the channel width, and L is the channel length.

Referring to FIG. 15, gate-to-source voltage values $V_{GSO}$ to $V_{GSMAX}$ have a relation $V_{GSO}=0<V_{GS1}<V_{GS2}<V_{GS3}<V_{GS4}<V_{GSMAX}$. That is, when the drain-to-source voltage value $V_{DS}$ is constant, the source-to-drain current value $I_{DS}$ increases in both the unsaturated area and the saturated area as the gate-to-source voltage value $V_{GS}$ increases. In addition, as the gate-to-source voltage value $V_{GS}$ increases, the drain saturation threshold voltage $V_{TH}$ also increases.

As is apparent from the above description, in the unsaturated area, if the drain-to-source voltage value $V_{DS}$ even slightly changes, the source-to-drain current value $I_{DS}$ changes. In the saturated area, however, when the gate-to-source voltage value $V_{GS}$ is defined, the source-to-drain current value $I_{DS}$ is uniquely defined. The source-to-drain current level $I_{DS}$ when the third transistor 110 has the gate-to-source voltage level $V_{GSMAX}$ is set to a current level which flows between the pixel electrode 116 and the counter transparent electrode 113 of the organic EL element $E_{i,j}$ which emits light at the maximum luminance.

Figure 16:
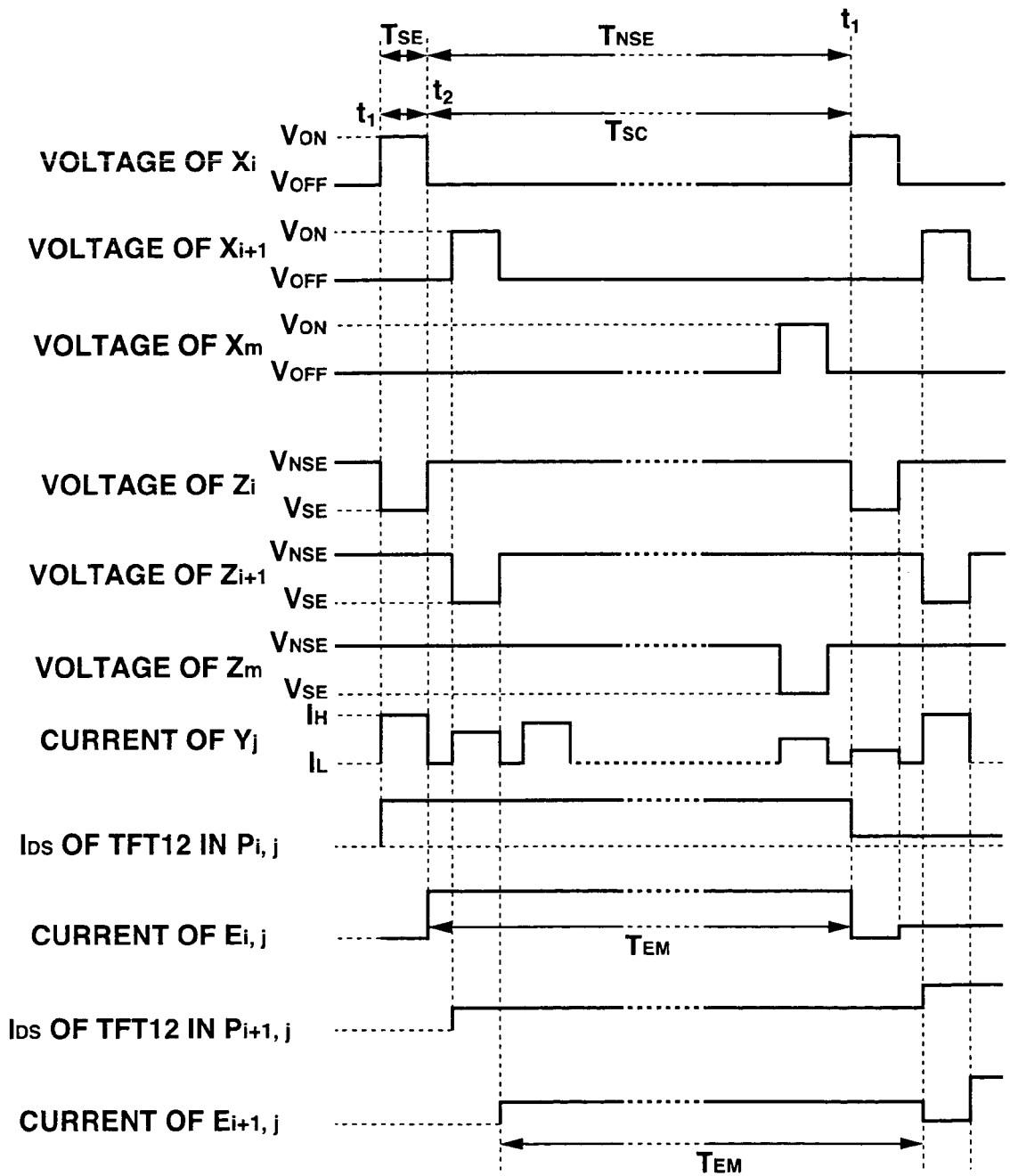
FIG. 16 is a timing chart showing the operation of a driving circuit.

The operation of the pixel driving circuit $D_{i,j}$ having the above-described arrangement, the method of driving the pixel driving circuit $D_{i,j}$, and the operation of the display apparatus 101 will be described next with reference to the timing chart shown in FIG. 16. Referring to FIG. 16, a period $T_{SE}$ is a selection period, a period $T_{NSE}$ is a nonselection period, and a period $T_{SC}$ is one scanning period. Note that $T_{SC}=T_{SE}+T_{NSE}$.

In accordance with the control signals φs output from the controller 106, the selection scan driver 103 sequentially outputs a pulse of high level (ON level) to the selection scan line $X_1$ of the first row to the selection scan line $X_m$ of the mth row. In addition, in accordance with the control signals φe output from the controller 106, the voltage source driver 104 sequentially outputs a pulse of low level to the voltage source scan line $Z_1$ of the first row to the voltage source scan line $Z_m$ of the mth row.

As shown in FIG. 16, in each row, the output timing of the high-level voltage to the selection scan line $X_i$ almost equals the output timing of the low-level pulse to the voltage source scan line $Z_i$. The time length of the high-level voltage of the voltage source scan line $Z_i$ almost equals the time length of the low-level voltage of the voltage source scan line $Z_i$. The period while the high-level pulse and low-level pulse are output is the selection period $T_{SE}$ of the row. During the selection period $T_{SE}$ of each row, the data driver 105 generates storage currents (i.e., currents toward the data driver 105) for the current lines $Y_1$ to $Y_n$ of all columns in accordance with the control signals φd output from the controller 106. The data driver 105 supplies, to the current line $Y_j$ of each column, a storage current having a value corresponding to image data received by the controller 106.

The current flow and voltage application of the pixel $P_{i,j}$ will be described in detail.

At start time $t_1$ of the selection period $T_{SE}$ of the ith row, the selection scan driver 103 starts outputting the voltage of ON level (high level) to the selection scan line $X_i$ of the ith row. During the selection period $T_{SE}$ from times $t_1$ to $t_2$, the scan signal voltage $V_{ON}$ having a level that turns on the first transistors 108 and second transistors 109 is applied to the selection scan line $X_i$. During the selection period $T_{SE}$ of the ith row, the selection voltage $V_{SE}$ equal to or lower than the reference potential $V_{SS}$ is applied to the voltage source scan line $Z_i$. In addition, during the selection period $T_{SE}$, the data driver 105 flows storage currents having predetermined values in accordance with image data received by the controller 106.

Accordingly, during the selection period $T_{SE}$, the first transistor 108 is turned on to supply a current from the drain to the source. A voltage is applied to the gate of the third transistor 110 and one terminal of the capacitor 117 to turn on the third transistor 110. Furthermore, during the selection period $T_{SE}$, the second transistor 109 is turned on, and the data driver 105 is going to supply the storage currents corresponding to the image data to the current lines $Y_1, Y_2, \ldots, Y_j, Y_{j+1}, \ldots, Y_n$. At this time, to supply the storage currents to the current lines $Y_1, Y_2, \ldots, Y_j, Y_{j+1}, \ldots, Y_n$, the data driver 105 sets the current lines $Y_1, Y_2, \ldots, Y_j, Y_{j+1}, \ldots, Y_n$ to a voltage which is equal to or lower than the selection voltage $V_{SE}$ and also equal to or lower than the reference potential $V_{SS}$ to make the potential of the source electrode 110S of the third transistor 110 lower than the drain potential.

Figure 13:
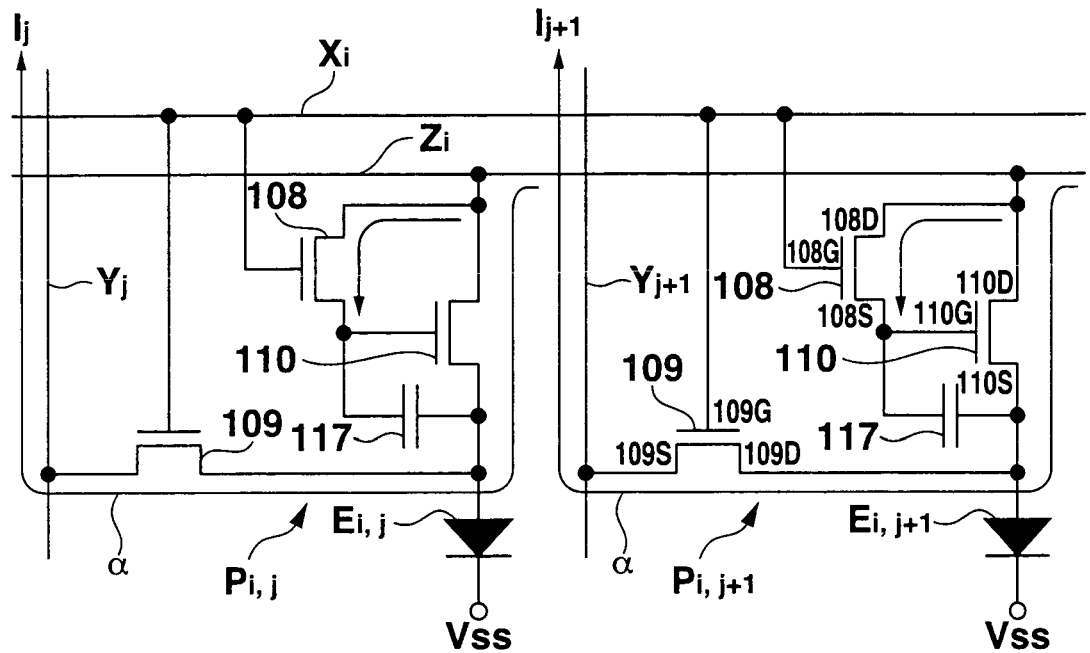
FIG. 13 is an equivalent circuit diagram of pixels in the display apparatus for explaining the driving principle during the selection period.

A potential difference is generated between the gate and the source of the third transistor 110. Hence, as shown in FIG. 13, storage currents $I_1, I_2, \ldots, I_j, I_{j+1}, \ldots, I_n$ having current values designated by the data driver 105 (i.e., current values corresponding to the image data) flow in a direction indicated by an arrow $\alpha$. During the selection period $T_{SE}$, the selection voltage $V_{SE}$ of the voltage source scan line $Z_i$ is equal to or lower than the reference potential $V_{SS}$. Hence, the potential of the anode of the organic EL element $E_{i,j}$ is lower than the potential of the cathode. That is, a reverse bias voltage is applied to the organic EL element $E_{i,j}$. For this reason, the current from the voltage source scan line $Z_i$ does not flow to the organic EL element $E_{i,j}$.

At this time, the other terminal (connected to the source electrode 10S of the third transistor 110) of each of the capacitors 117 of the pixels $P_{i,1}$ to $P_{i,n}$ has a potential corresponding to the current value controlled (designated) by the data driver 105. The potential is lower than the gate potential of the third transistor 110. More specifically, the capacitor 117 of each of the pixels $P_{i,1}$ to $P_{i,n}$ stores charges which generate a potential difference between the gate and the source of the corresponding third transistor 110 so as to supply a corresponding one of the currents $I_1$ to $I_n$ to the third transistor 110 of the corresponding one of the pixels $P_{i,1}$ to $P_{i,n}$. The potential at an arbitrary point on the wiring line from the third transistor 110 to the current line $Y_j$ changes depending on, e.g., the internal resistance in the second transistor 109 and third transistor 110, which changes over time. However, the current supplied by current control by the data driver 105 exhibits a predetermined current value. For this reason, even when the resistance of the second transistor 109 and third transistor 110 becomes high, and the potential between the gate and the source of the third transistor 110 changes, the predetermined value of the current that flows in the direction indicated by the arrow $\alpha$ does not change.

Figure 14:
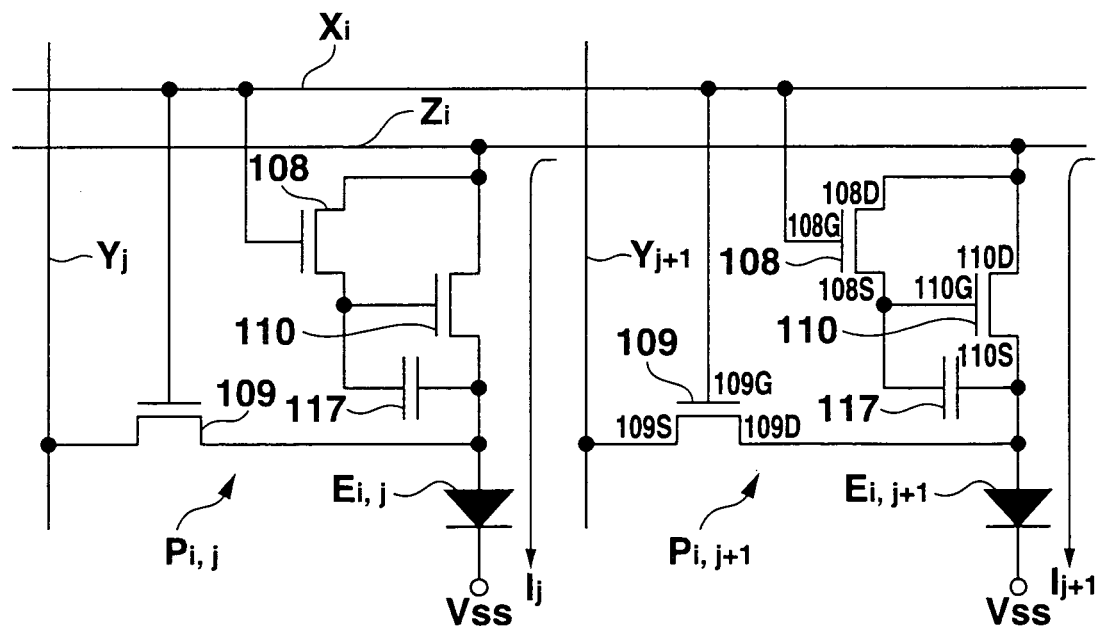
FIG. 14 is an equivalent circuit diagram of pixels in the display apparatus for explaining the driving principle during the non-selection period.

At end time $t_2$ of the selection period $T_{SE}$, the high-level pulse output from the selection scan driver 103 to the selection scan line $X_i$ is ended, and the low-level pulse output from the voltage source driver 104 to the voltage source scan line $Z_i$ is ended. That is, during the nonselection period $T_{NSE}$ from end time $t_2$ to start time $t_1$ of the next selection period $T_{SE}$, the scan signal voltage $V_{OFF}$ of OFF level (low potential) is applied to the gates of the first transistors 108 and second transistors 109 on the selection scan line $X_i$. Simultaneously, the nonselection voltage $V_{NSE}$ much higher than the reference potential $V_{SS}$ is applied to the voltage source scan line $Z_i$. For this reason, as shown in FIG. 14, during the nonselection period $T_{NSE}$, the second transistors 109 are turned off, and no currents flow to the current lines $Y_1$ to $Y_n$. Furthermore, during the nonselection period $T_{NSE}$, the first transistors 108 are turned off.

The organic EL element $E_{i,j}$ cannot avoid the degradation over time with which the resistance gradually rises in a long term. Hence, the divided resistance in the organic EL element $E_{i,j}$ gradually rises. When a constant voltage is applied, the voltage applied to a transistor connected in series with the organic EL element $E_{i,j}$ may become relatively low. Let $V_E$ be the maximum internal voltage of the organic EL element $E_{i,j}$, which is necessary for the organic EL element $E_{i,j}$ to emit light at the maximum luminance during the light emission service life period. During the nonselection period $T_{NSE}$ after the selection period $T_{SE}$, as shown in FIG. 15, a condition given by $$V_{NSE} - V_E - V_{SS} \geq V_{THMAX} \qquad (2)$$

is satisfied such that the source-to-drain path of the third transistor 110 maintains the saturated area even when the gate-to-source voltage $V_{GS}$ of the third transistor 110 is $V_{GSMAX}$, i.e., the source-to-drain current $I_{DS}$ of the third transistor 110 is controlled by only the gate-to-source voltage $V_{GS}$ of the third transistor 110 independently of its drain-to-source voltage $V_{DS}$.

$V_{THMAX}$ is the saturation threshold voltage between the source and the drain of the third transistor 110 at $V_{GSMAX}$. In consideration of the displacement of the saturation threshold value and a variation in characteristics between the plurality of third transistors 110 of the display unit 107, which are caused by the degradation over time of the third transistors 110, $V_{THMAX}$ is set to a voltage which is expected to be maximum within the range where the third transistor 110 can normally drive when $V_{GSMAX}$ is supplied to the gate of the third transistor 110.

The capacitor 117 continuously holds, at one terminal and the other terminal, the charges accumulated during the selection period $T_{SE}$. The third transistor 110 continuously maintains the ON state. That is, the gate-to-source voltage value $V_{GS}$ of the third transistor 110 during the nonselection period $T_{NSE}$ equals that during the selection period $T_{SE}$ before the nonselection period $T_{NSE}$. For this reason, even during the nonselection period $T_{NSE}$, the third transistor 110 continuously supplies the display current equal to the storage current having the value corresponding to the image data in the selection period $T_{SE}$. However, since the second transistor 109 is OFF, the current flows toward the low reference potential $V_{SS}$ through the organic EL element $E_{i,j}$, as indicated by equation (2). Accordingly, the display current, i.e., the source-to-drain current $I_{DS}$ of the third transistor 110 flows to the organic EL layer 115 between the pixel electrode 116 and the counter transparent electrode 113 of the organic EL element $E_{i,j}$ so that the organic EL element $E_{i,j}$ emits light.

As described above, during the selection period $T_{SE}$, the data driver 105 forcibly supplies a storage current between the source and the drain of the third transistor 110 through the current line $Y_j$ in accordance with image data. During the nonselection period $T_{NSE}$, the data driver 105 supplies a display current equal to the extracted storage current to the organic EL element $E_{i,j}$. Hence, the third transistor 110 can supply a desired current corresponding to the image data regardless of the variation in its characteristic or the displacement of the characteristic caused by the degradation over time. In addition, even when the resistance of the organic EL element $E_{i,j}$ rises over time, it can execute stable luminance gray level display because a desired current flows to the organic EL element $E_{i,j}$. In one pixel, only the third transistor 110 serving as a current control transistor is connected in series with the organic EL element $E_{i,j}$. Only two components, i.e., the organic EL element $E_{i,j}$ and third transistor 110 divide the voltage applied to the voltage source scan line $Z_i$.

For this reason, driving at a low voltage and low power consumption is possible. In addition, since the number of transistors in a pixel can be suppressed, the occupation area (aperture ratio) of the light emission region of the pixel can be increased.

When the selection period $T_{SE}$ of the selection scan line $X_i$ is ended, the selection period $T_{SE}$ of the selection scan line $X_{i+1}$ starts. The selection scan driver 103, voltage source driver 104, data driver 105, and controller 106 operate in the same way as for the selection scan line $X_i$. In this way, the organic EL elements $E_{1,1}$ to $E_{1,n}$, $E_{2,1}$ to $E_{2,n}$, ..., $E_{m,1}$ to $E_{m,n}$ are line-sequentially selected, and the selection periods of the selection scan lines $X_1$ to $X_m$ are sequentially ended. After that, the selection period $T_{SE}$ of the selection scan line $X_1$ starts again. As described above, a light emission period $T_{EM}$ when the pixels emit light during one scanning period $T_{SC}$ almost corresponds to the nonselection period $T_{NSE}$. As the number of selection scan lines increases, the light emission period $T_{EM}$ can be made long.

Since the active matrix driving display apparatus 101 using current control can be implemented by forming the three, first transistor 108, second transistor 109, and third transistor 110 in one pixel $P_{i,j}$, the image characteristic of the display apparatus 101 is excellent. That is, in the active matrix driving display apparatus 101 which controls the current value, in the present invention, the ratio of the light emission area of the pixel $P_{i,j}$ can be made high. Hence, extra margins can be ensured as other design margins. When the ratio of the light emission area increases, the apparent brightness of the display surface of the display apparatus 101 can be increased. In addition, in display at a desired apparent brightness, the value of the flowing current per unit area of the EL layer 115 can be made smaller. Hence, the light emission service life of the organic EL element $E_{i,j}$ can be prolonged.

As described above, in the driving method which controls the luminance gray level of the organic EL elements by the current value of the current flowing to the transistors, the parasitic capacitance to each current line must be charged until the current value of the storage current to be supplied to the current lines becomes steady. The current value of the storage current depends on the characteristic of the organic EL elements and is very small. For this reason, if the selection period $T_{SE}$ (to be described later) is short, the parasitic capacitance cannot sufficiently be charged up, and the storage current may be unable to have the desired current value. However, since the current lines $Y_1$ to $Y_n$ shown in FIG. 6 are divided into T groups, i.e., $Y_{11}, Y_{21}, \ldots, Y_{T1}, Y_{12}, Y_{22}, \ldots, Y_{T2}, \ldots, Y_{1n}, Y_{2n}, \ldots, Y_{Tn}$, as shown in FIG. 8, the parasitic capacitance required until the current value of the storage current becomes steady can be reduced to 1/T. Hence, the current value can sufficiently become steady even when the selection period $T_{SE}$ is short. For this reason, one frame period can be shortened.

Furthermore, since a reverse bias voltage is applied to the organic EL element $E_{i,j}$ during the selection period $T_{SE}$, the element service life of the organic EL element $E_{i,j}$ becomes long. In the above embodiment, all the first transistor 108, second transistor 109, and third transistor 110 of each pixel driving circuit $D_{i,j}$ are single-channel FETs including only n-channels whose semiconductor layers are made of amorphous silicon. The first transistor 108, second transistor 109, and third transistor 110 can be formed on the interlayer dielectric film 134 simultaneously by one step. For this reason, any increase in time or cost for manufacturing the display unit 107, display apparatus 101, and pixel driving circuits $D_{i,j}$ can be suppressed. Even when p-channel FETs are employed as the first transistor 108, second transistor 109, and third transistor 110, the same effect as described above can be obtained. At this time, the signals shown in FIG. 16 have opposite phases.

The pixel driving circuits $D_{1,1}$ to $D_{m,n}$ of the display apparatus 101 are of a current gray level type which displays multiple gray levels by controlling the current value of the storage current flowing to one of the third transistors 110, as will be described later. However, the present invention is not limited to this. The pixel driving circuits may be of a voltage gray level type which displays multiple gray levels by controlling the voltage value of the signal voltage applied to the pixel driving circuits $D_{1,1}$ to $D_{m,n}$.

An application example in which the display apparatus 1 or 101 of the above embodiments is mounted in a digital still camera will be described below with reference to FIG. 17.

Figure 17:
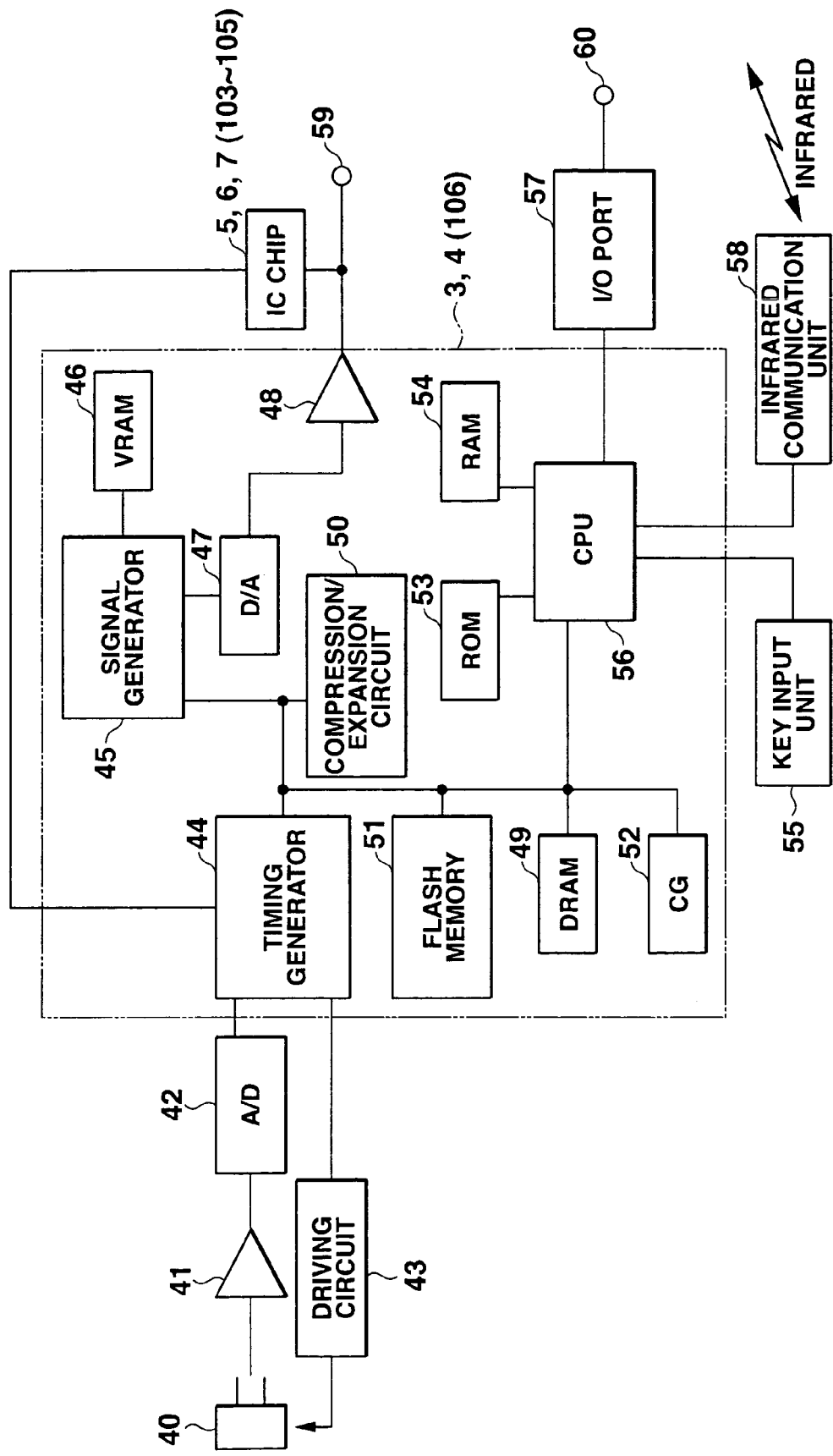
FIG. 17 is a schematic circuit block diagram of a digital still camera which uses the display apparatus of the present invention as a display panel.

Referring to FIG. 17, the digital camera includes the IC chips 3 to 7 (or the selection scan driver 103, voltage source driver 104, data driver 105, and controller 106), a CCD image sensing element 40, amplifier 41, analog-to-digital (Analog to Digital) converter 42, driving circuit 43, key input unit 55, I/O port 57, and infrared communication unit 58. Each of the IC chips 3 and 4 (or the controller 106) includes a timing generator 44, a signal generator 45, VRAM (Video Random Access Memory) 46, digital-to-analog converter 47, amplifier 48, DRAM (Dynamic Random Access Memory) 49, compression/expansion circuit 50, flash memory 51, CG (Character Generator) 52, ROM (Read Only Memory) 53, RAM (Random Access Memory) 54, and CPU (Central Processing Unit) 56.

The CCD image sensing element 40 includes a pixel surface formed by two-dimensionally arraying a number of elements (pixels) each having a transfer electrode stacked on a light-receiving portion such as a photodiode, and an output unit which converts charges accumulated in each pixel into a voltage and outputs it. An image is formed on the CCD image sensing element 40 through an imaging lens. Light that becomes incident through the imaging lens is received by the pixel surface. Charges proportional to the light-receiving amount is accumulated in each pixel. The charges accumulated in each pixel are sequentially read out by the output unit as an image sensing signal (analog signal) in accordance with a driving signal supplied from the driving circuit 43 and output to the analog-to-digital converter 42 through the amplifier 41.

The analog-to-digital converter 42 converts the image sensing signal input from the CCD image sensing element 40 through the amplifier 41 into a digital signal and supplies it to the timing generator 44.

The driving circuit 43 executes driving control of the exposure and read timings of the CCD image sensing element 40 on the basis of a timing signal supplied from the timing generator 44. The timing generator 44 generates the timing signal which controls the driving circuit 43 on the basis of a video reception signal input from the CPU 56. The timing generator 44 also outputs clock signals to the IC chips 5, 6, and 7 (or the selection scan driver 103, voltage source driver 104, and data driver 105) to operate the IC chips 5, 6, and 7 at predetermined timings.

The signal generator 45 executes color arithmetic processing for the image sensing signal (digital signal) supplied through the timing generator 44 to generate image data containing a luminance signal (Y data) and chrominance signals (C data), and outputs the image data to the DRAM 49.

The signal generator 45 also generates a video signal (digital signal) by adding a sync signal to the image data supplied from the DRAM 49 by the CPU 56 and temporarily stores the video signal in the VRAM 46. After that, the video signal stored in the VRAM 46 is output to the IC chips 5, 6, and 7 through the digital-to-analog converter 47 and amplifier 48. When an external device is connected to a video output terminal 59 via a video cable, the video signal is also output to the external device.

The VRAM 46 is a video memory which temporarily stores the video signal (display data) generated by the signal generator 45. The VRAM 46 has a memory capacity capable of storing display data of one frame of the IC chips 5, 6, and 7.

The digital-to-analog converter 47 converts the video signal (display data) supplied from the VRAM 46 by the signal generator 45 from a digital signal to an analog signal and outputs it to the IC chips 5, 6, and 7 through the amplifier 48. When an external device is connected to the video output terminal 59 via a video cable, the video signal is also output to the external device.

The IC chips 5, 6, and 7 output, to the wiring lines 13 to 18 of the electroluminescent display apparatus 1, an image signal and selection scan signals to the display screen on the basis of the video signal (display data) input through the digital-to-analog converter 47 and amplifier 48. The electroluminescent display apparatus 1 can display, as a viewfinder, an object image which is received by the CCD image sensing element 40 at the time of photographing. After photographing, sensed image data which is stored in the flash memory 51 can be displayed.

The DRAM 49 is a semiconductor memory which temporarily stores sensed image data supplied from the signal generator 45 or image data which is read out from the flash memory 51 by the CPU 56 and expanded by the compression/expansion circuit 50 (to be described below).

The compression/expansion circuit 50 compresses the image data stored in the DRAM 49 by encoding. More specifically, the image data is compressed (encoded) by a predetermined encoding method, i.e., a method corresponding to the type of images to be processed (in this example, still images), for example, DCT (Discrete Cosine Transform) for every 8×8 pixels based on the JPEG (Joint Photographic Experts Group) algorithm, quantization, or Huffman coding. The compressed image data is output to the flash memory 51. The compression/expansion circuit 50 also decodes and expands the compressed image data stored in the flash memory 51 and outputs the image data to the DRAM 49.

The flash memory 51 is a semiconductor memory which stores a plurality of image data compressed by the compression/expansion circuit 50. A plurality of pairs of "page No. data" and "image data" corresponding to it are stored.

"Page No. data" is numerical data which represents the storage order of image data and is assigned in accordance with the storage order in the flash memory 51. For example, first image data stored in the flash memory 51 is assigned "1" as "page No. data". Image data stored next is assigned "2" as "page No. data".

When the apparatus is powered off by pressing the power switch, the flash memory 51 stores "page No. data" of the last sensed image data+1, the "page No. data" of image data which is played back and displayed finally, and various kinds of image sensing conditions stored in an image sensing condition memory (to be described later) in the RAM 54.

The CG 52 is a memory which stores character data such as kana, kanji, alphanumerical, and symbol data for operation guidance, which are to be displayed on the electroluminescent display apparatus 1.

The ROM 53 stores various control programs to control the units of the digital camera, which are executed by the CPU 56 for, e.g., communication processing as well as image sensing processing, playback/display processing, continuously sensed image playback/display processing, and comment image synthesis processing. The various control programs are stored in a form of program codes readable by the CPU 56.

The RAM 54 forms a work memory which expands programs for various kinds of control processing executed by the CPU 56 or temporarily stores various kinds of data to be processed, or an image sensing condition memory which stores various kinds of image sensing conditions set by image sensing processing. In addition, a formal comment text storage table and plate storage table are read out from the ROM 53 by the CPU 56 and rasterized on the RAM 54.

The image sensing condition memory in the RAM 54 includes "start page No. data", "end page No. data", "page No. data", and other various kinds of image sensing condition data (e.g., the shutter speed, F-number, and photographing time interval in a continuous shooting mode) (not shown).

"Start page No. data" stores unassigned new "page No. data" which is to be made to correspond to an image to be sensed later by image sensing processing. "End page No. data" stores "page No. data" at a timing when a series of shutter pressed states are ended in image sensing processing (to be described later).

"Page No. data" has the same format as "page No. data" stored in correspondence with each image data in the flash memory 51. The "page No. data" is data in the RAM 54 to temporarily store "page No. data" which stores an image sensed by image sensing processing. The value of "page No. data" is incremented when image sensing processing of one image is ended.

The plate storage table stores a plurality of "plate image data" having different shapes. Each plate corresponds to "storage No. data". When a comment text is to be synthesized with a sensed image (image data) by comment image synthesis processing, the comment text overlapping a plate can be synthesized with the sensed image.

The key input unit 55 includes a mode changeover switch, power switch, shutter key, menu key, "+" key, and "−" key. The key input unit 55 outputs various kinds of operation signals to the CPU 56 in accordance with the pressing or sliding operation on the keys.

The CPU 56 is a central processing unit which controls the units of the digital camera in accordance with the various kinds of control programs stored in the ROM 53. More specifically, when the mode changeover switch is slid to designate the image sensing mode, and the shutter key is continuously set in the pressed state, the CPU 56 executes image sensing processing.

When the shutter key is pressed, the CPU 56 executes image sensing processing and outputs a video reception signal to the timing generator 44. The timing generator 44 generates a timing signal on the basis of the video reception signal and outputs the timing signal to the driving circuit 43. The driving circuit 43 executes driving control of the exposure and read timings of the CCD image sensing element 40 on the basis of the timing signal to make the CCD image sensing element 40 receive the image sensing signal. The analog-to-digital converter 42 converts the received image sensing signal from an analog signal to a digital signal. The signal generator 45 executes color arithmetic processing for the image sensing signal to generate image data and stores it in the DRAM 49. The CPU 56 transfers the image data stored in the DRAM 49 to the compression/expansion circuit 50 to compress the image data. Then, the compressed image data is stored in the flash memory 51 in correspondence with new "page No. data".

After that, the CPU 56 stands by for a predetermined time corresponding to the photographing time interval in the continuous shooting mode, which is included in the various kinds of image sensing conditions rasterized on the image sensing condition memory in the RAM 54 and determines whether the shutter key is in a pressed state. If the shutter key is in a pressed state, continuous shooting is should be executed. The CPU 56 increments the value of "page No. data" in the RAM 54 and stores it again in the RAM 54. Image data sensed in accordance with the same procedures as in the above-described operation is compressed and stored in the flash memory 51 in correspondence with the "page No. data" stored in the RAM 54 again.

When the mode changeover switch is slid to designate a playback mode, the CPU 56 executes playback/display processing (to be described later).

In playback/display processing, the CPU 56 designates, from image data stored in the flash memory 51, image data to be played back and displayed in the order of page No. (in the ascending order when a "+" key 17a is pressed or in the descending order when the "−" key is pressed) in accordance with the pressing operation on the "+" or "−" key. The designated image data is sequentially read out from the flash memory 51 and transferred to the compression/expansion circuit 50. After expansion, the image data is stored in the DRAM 49.

After that, the CPU 56 transfers the image data stored in the DRAM 49 to the signal generator 45. The signal generator 45 generates a video signal (digital signal) by adding a sync signal to the received image data and temporarily stores the video signal in the VRAM 46. Image data of one frame is read out from the VRAM 46 and output to the IC chips 5, 6, and 7 through the digital-to-analog converter 47 and amplifier 48. The electroluminescent display apparatus 1 plays back and displays the image.

When comment image synthesis is instructed by a predetermined operation by the user in the playback/display processing, the CPU 56 executes comment image synthesis processing.

In comment image synthesis processing, sensed image data that is stored in the DRAM 49 is selected and designated as a synthesis target by the key operation on the key input unit 55. For this image data, image data of a plate to be synthesized is designated from the plate storage table, and comment text data to be synthesized is designated from the formal comment text storage table by the key operation on the key input unit 55. For the designated image data, comment text image data, and plate image data, the CPU 56 controls to set synthesis conditions such as the comment image synthesis position on the image as the synthesis target. On the basis of the various kinds of synthesis conditions set, the comment text image data is made to overlap the plate image data to generate comment image data.

The I/O (Input/Output) port 57 is an interface which executes input/output control of series data (image data or control data) exchanged between the digital camera, an input/output terminal 60, and an external device connected via a communication cable.

The infrared communication unit 58 is an infrared interface to execute IrDA (Infrared Data Association) infrared communication between the electroluminescent display apparatus 1 and the external device. The infrared communication unit 58 executes transmission/reception control of image data or control data exchanged by infrared communication.

More specifically, the infrared communication unit 58 includes a transmission data memory which temporarily stores transmission data to be transmitted to an external device having an infrared communication function, a modulation unit which modulates the data stored in the transmission data memory into an infrared signal, a transmission LED which transmits the modulated infrared signal to the external device by an infrared pulse through an infrared window, a photodiode which receives, through an infrared window, the infrared signal transmitted from the external device by the infrared pulse, a demodulation unit which demodulates the received infrared signal as reception data, and a reception data memory which temporarily stores the demodulated reception data.

What is claimed is:

1. A display apparatus comprising:
   a board;
   a driving circuit mounted on the board in a display region;
   a coating film which coats the driving circuit;
   a display unit including a plurality of optical elements which are arrayed as pixels on the coating film in the display region, and which are driven by the driving circuit;
   a plurality of current lines; and
   a plurality of voltage source scan lines;
   wherein each of the optical elements comprises an organic electroluminescent element which includes a pair of electrodes and which emits light in a direction away from the board in accordance with a current that flows between the pair of electrodes,
   wherein the display further comprises, for each of the optical elements, a current storage circuit which stores current data corresponding to a value of a storage current which flows through one of the current lines during a selection period of the optical element and which supplies a display current having a value substantially equal to the value of the storage current to the optical element during a nonselection period of the optical element in accordance with the current data stored during the selection period,
   wherein the current storage circuit for each of the optical elements is connected to one of the voltage source scan lines, and a voltage to supply the display current to the optical element is output to the voltage scan lines,
   wherein one end of a current path of the current storage circuit is connected to the optical element, and the other end of the current path is connected to said one of the voltage source scan lines,
   wherein the driving circuit comprises a voltage source driver which applies a voltage to supply the storage current to the current storage circuit during the selection period through said one of the voltage source scan lines, and which applies the voltage to supply the display current to the optical element to the current storage circuit through said one of the voltage source scan lines during the nonselection period, so as to supply the display current having the value substantially equal to the value of the storage current, which has been supplied to the current storage circuit during the selection period, in accordance with the current data stored in the current storage circuit during the selection period,
   wherein one of the pair of electrodes of each of the optical elements is connected to the current storage circuit for the optical element, and the other is connected to a constant voltage source, and
   wherein the voltage outputted by the voltage source driver during the selection period is not more than a potential of the constant voltage source, and the voltage outputted by the voltage source driver during the nonselection period is not less than the voltage output during the selection period and more than the potential of the constant voltage source.

2. An apparatus according to claim 1, wherein the display unit comprises a plurality of first conductive lines which are formed parallel to each other on the coating film, and a plurality of second conductive lines which are arrayed on said plurality of first conductive lines to be perpendicular to the first conductive lines and which permit light to pass, wherein the plurality of current lines are one of the plurality of first conductive lines and the plurality of second conductive lines, and wherein each of the organic electroluminescent elements comprises:

an electroluminescent layer which is sandwiched between a portion of one of the first conductive lines and a portion of one of the second conductive lines at a position where said one one of the first conductive lines crosses said one of the second conductive lines; and the portion of said one of the first conductive lines and the portion of said one of the second conductive lines which sandwich the electroluminescent layer.

3. An apparatus according to claim 1, wherein the driving circuit includes a plurality of IC chips.

4. An apparatus according to claim 3, wherein the driving circuit, which is mounted on the board and coated with the coating film, comprises a CPU which controls the driving circuit.

5. An apparatus according to claim 3, wherein the driving circuit, which is mounted on the board and coated with the coating film, comprises a frame memory which temporarily stores image data.

6. An apparatus according to claim 1, wherein the display unit includes a plurality of display unit sections which execute display simultaneously.

7. An apparatus according to claim 1, wherein the display unit further comprises, for each of the optical elements, a switch circuit which supplies the storage current having a predetermined value to said one of the current lines during the selection period of the optical element and which stops supplying the current to the current line during the nonselection period of the optical element.

8. An apparatus according to claim 7, wherein the current storage circuit has a current control transistor which is connected in series with the optical element.

9. An apparatus according to claim 8, wherein the current storage circuit further comprises a capacitor which is arranged between a gate and a source of the current control transistor and into which charges are written as the current data.

10. An apparatus according to claim 7, wherein the switch circuit comprises a current path control transistor which has a current path with one end connected to the current line, which supplies the storage current to the current line during the selection period, and which stops supplying the current to the current line during the nonselection period.

11. An apparatus according to claim 7, wherein the switch circuit comprises a current data write control transistor which controls writing of the current data into the current storage circuit.

12. An apparatus according to claim 7, wherein the current storage circuit comprises a current control transistor which is connected in series with the optical element, and wherein the switch circuit comprises a current path control transistor which supplies the storage current to the current line during the selection period, and a current data write control transistor which writes the value of the storage current that flows to the current line between a gate and a source of the current control transistor as the current data during the selection period.

13. An apparatus according to claim 7, wherein each of the pixels comprises one of the optical elements, one of the current storage circuits, and one of the switch circuits.

14. An apparatus according to claim 7, wherein the driving circuit comprises a data driver which, for each of the optical elements, supplies the storage current from the current storage circuit to the current line during the selection period.

15. An apparatus according to claim 7, further comprising a plurality of selection scan lines, to which a selection scan signal which selects the switch circuits for the optical elements is selectively output.

16. An apparatus according to claim 15, further comprising a selection scan driver which outputs the selection scan signal to the selection scan lines.

17. An apparatus according to claim 7, further comprising:

a plurality of selection scan lines to which a selection scan signal which selects the switch circuits for the optical elements is selectively output;

wherein, for each of the optical elements:

the current storage circuit comprises a current control transistor which has a current path with a first end connected to the optical element and a second end connected to one of the voltage source scan lines; and the switch circuit comprises a current data write control transistor which has a control terminal connected to one of the selection scan lines and a current path with a first end connected to a control terminal of the current control transistor and a second end connected to one of: said one of the voltage source scan lines and said one of the selection scan lines, and a current path control transistor which has a control terminal connected to said one of the selection scan lines and a current path with a first end connected to the current line and a second end connected to the first end of the current control transistor.

18. An apparatus according to claim 17, wherein the driving circuit comprises:

a selection scan driver which outputs the selection scan signal to the selection scan lines;

a data driver which, for each of the optical elements, supplies the storage current to the current line and the current storage circuit during the selection period.

* * * * *